US012744305B2

(12) United States Patent
Igarashi et al.

(10) Patent No.: US 12,744,305 B2
(45) Date of Patent: Sep. 22, 2026

(54) SEMICONDUCTOR DEVICE AND ELECTRONIC DEVICE

(71) Applicant: SONY SEMICONDUCTOR SOLUTIONS CORPORATION, Kanagawa (JP)

(72) Inventors: Takahiro Igarashi, Kanagawa (JP); Shuichi Oka, Kanagawa (JP); Shun Mitarai, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 364 days.

(21) Appl. No.: 18/548,661

(22) PCT Filed: Mar. 2, 2022

(86) PCT No.: PCT/JP2022/008740
§ 371 (c)(1),
(2) Date: Sep. 1, 2023

(87) PCT Pub. No.: WO2022/190971
PCT Pub. Date: Sep. 15, 2022

(65) Prior Publication Data
US 2024/0145901 A1 May 2, 2024

(30) Foreign Application Priority Data
Mar. 11, 2021 (JP) ................................ 2021-038897

(51) Int. Cl.
*H01Q 1/22* (2006.01)
*H01Q 9/04* (2006.01)
*H10F 39/00* (2025.01)

(52) U.S. Cl.
CPC ......... *H01Q 1/2283* (2013.01); *H01Q 9/0407* (2013.01); *H10F 39/804* (2025.01)

(58) Field of Classification Search
CPC ............ H01Q 1/38; H01Q 1/243; H01Q 7/00; H01Q 21/28; H01Q 1/273; H01Q 1/44; H01Q 9/42
See application file for complete search history.

(56) References Cited

U.S. PATENT DOCUMENTS

2008/0180215 A1* 7/2008 Mott .................... H01Q 1/2208 340/10.1
2011/0032685 A1 2/2011 Akiba et al.
(Continued)

FOREIGN PATENT DOCUMENTS

JP 2006-041644 2/2006
JP 2009-021564 1/2009
(Continued)

OTHER PUBLICATIONS

International Search Report and Written Opinion prepared by the Japan Patent Office on May 10, 2022, for International Application No. PCT/JP2022/008740, 2 pgs.

*Primary Examiner* — Wei (Victor) Y Chan
(74) *Attorney, Agent, or Firm* — SHERIDAN ROSS P.C.

(57) ABSTRACT

The present invention relates to a semiconductor device and an electronic device that facilitate calibration and can obtain favorable characteristics. The semiconductor device includes a substrate, a millimeter wave antenna provided on the substrate, and an image sensor provided on the substrate, in which an antenna surface of the millimeter wave antenna and a light receiving surface of the image sensor are disposed at spatially partitioned positions. The present technology can be applied to a sensor module.

14 Claims, 22 Drawing Sheets

(56) References Cited

U.S. PATENT DOCUMENTS

| | | | | |
|---|---|---|---|---|
| 2011/0122012 | A1 | 5/2011 | Van Zeijl | |
| 2013/0222613 | A1* | 8/2013 | Yehezkely | H01Q 1/44 348/207.1 |
| 2014/0326890 | A1* | 11/2014 | Debray | G01J 3/42 250/349 |
| 2015/0229023 | A1 | 8/2015 | Abe | |
| 2018/0059236 | A1 | 3/2018 | Wodrich | |
| 2018/0284222 | A1 | 10/2018 | Garrec | |
| 2019/0120931 | A1 | 4/2019 | Mihajlovic | |
| 2021/0376453 | A1* | 12/2021 | Han | H01Q 21/064 |

FOREIGN PATENT DOCUMENTS

| | | | |
|---|---|---|---|
| JP | 2011039340 | A | 2/2011 |
| JP | 2011-258654 | | 12/2011 |
| JP | 2012505115 | A | 3/2012 |
| JP | 2014-082365 | | 5/2014 |
| JP | 2019168455 | A | 10/2019 |
| JP | 2020501963 | A | 1/2020 |
| KR | 20180075858 | A | 7/2018 |
| WO | WO-2006035510 | A1 | 4/2006 |
| WO | WO-2016107908 | A1 | 7/2016 |
| WO | WO 2020/116205 | | 6/2020 |

* cited by examiner

SEMICONDUCTOR DEVICE AND ELECTRONIC DEVICE

CROSS REFERENCE TO RELATED APPLICATIONS

This application is a national stage application under 35 U.S.C. 371 and claims the benefit of PCT Application No. PCT/JP2022/008740, having an international filing date of 2 Mar. 2022, which designated the United States, which PCT application claimed the benefit of Japanese Patent Application No. 2021-038897 filed 11 Mar. 2021, the entire disclosures of each of which are incorporated herein by reference.

TECHNICAL FIELD

The present invention relates to a semiconductor device and an electronic device, and more particularly, to a semiconductor device and an electronic device that facilitate calibration and can obtain favorable characteristics.

BACKGROUND ART

In recent years, an image sensor for imaging an image and a sensing radar for measuring the position, speed, and the like may be used in combination. For example, a camera including an image sensor and a millimeter wave radar are mounted on a vehicle as in-vehicle components.

Furthermore, as a technology related to an image sensor, a technology has been proposed in which a structure is obtained in which an image sensor and a wireless communication chip for communication with a mobile device are disposed adjacent to each other on a wafer, and the image sensor and the wireless communication chip are covered with a protective cover (see, for example, Patent Document 1). According to this technology, since the structure and steps are simplified, reduction in manufacturing cost and improvement in productivity can be achieved.

CITATION LIST

Patent Document

Patent Document 1: Japanese Patent Application Laid-Open No. 2009-21564

SUMMARY OF THE INVENTION

Problems to be Solved by the Invention

However, in the above-described technology, in a case where an image sensor and a radar are used in combination, it has been difficult to facilitate calibration and obtain favorable characteristics.

For example, radars and cameras as in-vehicle components are basically disposed at positions away from each other. Therefore, it is necessary to perform calibration of the positional relationship for all of the radars and cameras depending on the mounting positions, and such calibration has been complicated.

In addition, in a case where a vehicle comes into contact with something, there is a possibility that the mounting position of each part mounted on the vehicle is shifted, and when such a shift occurs, it is necessary to perform the calibration again for all of the parts. In addition, for example, in a case where the state related to a vehicle changes by the air pressure of a tire, the number of passengers, or the like, the vehicle height and the distortion of the vehicle body also change. Therefore, it is desirable to perform calibration at regular time intervals.

Furthermore, for example, in applications such as the local 5G, in a case where a radio wave from a sensor or the like is received by a radar, discontinuity or interference of the radio wave may occur due to a shielding object, and therefore highly accurate antenna steering is required.

For example, by performing analysis of a video obtained by a camera and analyzing the presence of a shielding object, it is possible to reduce unnecessary radio wave emission.

However, since a camera and a radar are usually separate bodies, calibration of the positional relationship needs to be performed for each individual. Therefore, if the number of places where cameras and radars are installed, that is, the number of individuals increases, calibration is required for each of them, which results in complication.

Moreover, for example, as in the technology described in Patent Document 1, calibration of the positional relationship can be easily performed if a structure is obtained in which a camera and a radar are disposed adjacent to each other and covered with a protective cover, but there is a possibility that favorable characteristics cannot be obtained.

Specifically, for example, with such a structure, since a radio wave transmitted and received by the radar directly enters the image sensor, or the radio wave transmitted and received by the radar is scattered by the protective cover or the like, there is a high possibility that noise occurs in the image obtained by the image sensor. Furthermore, the intensity of a radio wave transmitted and received by the radar may decrease due to the influence of the protective cover covering the radar.

The present technology has been made in view of such a situation, and an object thereof is to facilitate calibration and obtain favorable characteristics.

Solutions to Problems

A semiconductor device of a first aspect of the present technology includes a substrate, a millimeter wave antenna provided on the substrate, and an image sensor provided on the substrate, in which an antenna surface of the millimeter wave antenna and a light receiving surface of the image sensor are disposed at spatially partitioned positions.

In the first aspect of the present technology, the antenna surface of the millimeter wave antenna and the light receiving surface of the image sensor are disposed at spatially partitioned positions on the substrate. Furthermore, an electronic device of a second aspect of the present technology is an electronic device including the semiconductor device of the first aspect of the present technology.

MODE FOR CARRYING OUT THE INVENTION

Hereinafter, embodiments to which the present technology is applied will be described with reference to the drawings.

First Embodiment

<Configuration Example of Sensor Module>

The present technology is to facilitate calibration of a positional relationship and obtain favorable characteristics by mounting an image sensor and an antenna of a radar at spatially partitioned positions on the same substrate.

Figure 1:
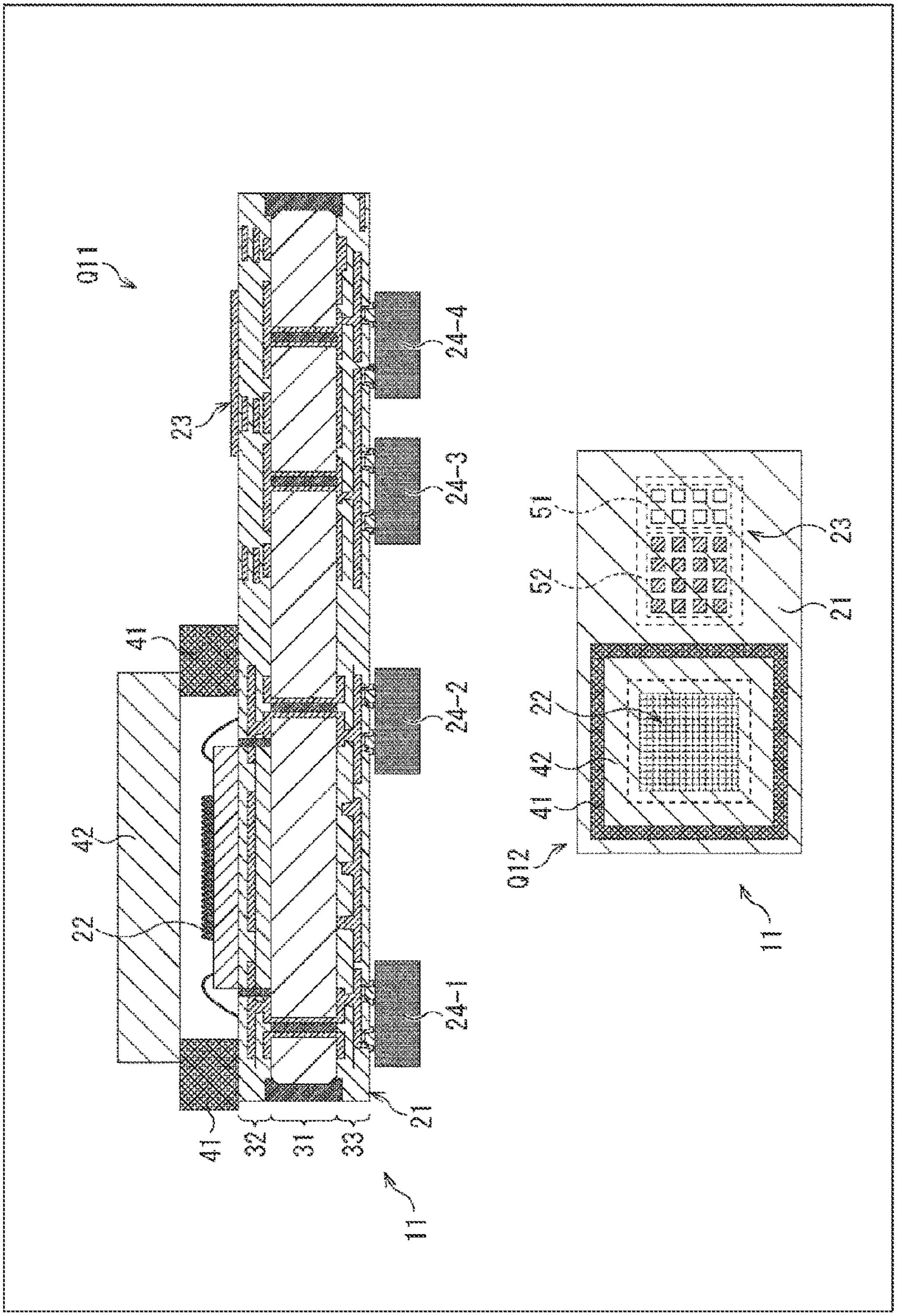
FIG. 1 is a diagram illustrating a configuration example of a sensor module.

FIG. 1 is a diagram illustrating a configuration example of an embodiment of a sensor module (package) which is an example of a semiconductor device to which the present technology is applied.

A sensor module 11 illustrated in FIG. 1 is mounted on a mobile device, a vehicle, a building component for a factory or a home, and the like, and has an imaging function (camera function) and a measurement function of measuring a position, a speed, and the like.

In this example, a cross section of the sensor module 11 is illustrated in the portion indicated by an arrow Q11, and a drawing of the sensor module 11 as viewed from above is illustrated in the portion indicated by an arrow Q12.

The sensor module 11 includes a semiconductor substrate 21, an image sensor 22, an antenna unit 23, and elements 24-1 to 24-4.

The semiconductor substrate 21 includes a core substrate 31, and a wiring layer 32 and a wiring layer 33 laminated on the core substrate 31.

In this example, in the drawing of the core substrate 31 in the portion indicated by the arrow Q11, the wiring layer 32 is formed on the upper surface, and in the drawing of the core substrate 31, the wiring layer 33 is formed on the lower surface. The wiring layer 32 and the wiring layer 33 are electrically connected by a through hole or the like provided in the core substrate 31.

In the drawing of the semiconductor substrate 21 in the portion indicated by the arrow Q11, the image sensor 22 that images a video by receiving and photoelectrically converting light incident from a subject is disposed (mounted) on the upper surface, that is, the surface of the wiring layer 32.

The image sensor 22 includes a complementary metal oxide semiconductor (CMOS) image sensor (CIS) or the like. For example, in a case where the image sensor 22 is a CIS, the sensor module 11 has a configuration in which an antenna of a millimeter wave radar is built in a CIS package.

Furthermore, a frame 41 surrounding the periphery of the image sensor 22 is provided on the semiconductor substrate 21, and a plate-like cover glass 42 is provided on the upper portion of the frame 41 so as to face the light receiving surface of the image sensor 22. The cover glass 42 functions as a protective cover (protective member) for the protection, dust-proofing, and drip-proofing of the light receiving surface of the image sensor 22.

In the sensor module 11, the image sensor 22 is disposed in a space surrounded by the semiconductor substrate 21, the frame 41, and the cover glass 42.

Furthermore, in the drawing of the semiconductor substrate 21 in the portion indicated by the arrow Q11, the antenna unit 23 including a plurality of patch antennas (radio frequency (RF) antennas) formed by patterning is provided on the upper surface, that is, the surface of the wiring layer 32. The antenna unit 23 functions as an antenna of a millimeter wave radar (millimeter wave antenna) for measuring a position, a speed, and the like.

Note that, here, the antenna unit 23 is drawn thick in order to make the drawing easy to see.

The portion indicated by the arrow Q12 illustrates the disposition of the image sensor 22 and the antenna unit 23 on the semiconductor substrate 21 when the sensor module 11 is viewed from above in the downward direction in the drawing of the portion indicated by the arrow Q11.

In this example, the antenna unit 23 is provided at a position near the image sensor 22 on the same surface of the semiconductor substrate 21.

Furthermore, the antenna unit 23 includes a transmission antenna unit 51 including a plurality of transmission (oscillation) patch antennas and a reception antenna unit 52 including a plurality of reception patch antennas.

In the transmission antenna unit 51, a plurality of transmission patch antennas is formed by being arranged in the longitudinal direction and the lateral direction in the drawing. Similarly, in the reception antenna unit 52, a plurality of reception patch antennas is formed by being arranged in the longitudinal direction and the lateral direction in the drawing. In particular, here, one square represents one patch antenna.

The transmission patch antennas and the reception patch antennas constituting the antenna unit 23 are formed on the surface of the semiconductor substrate 21 (the wiring layer 32) by patterning so as to be arranged on the same plane. The surface on which the transmission patch antennas and the reception patch antennas are arranged is the antenna surface (emission surface) of the millimeter wave antenna.

Furthermore, the elements 24-1 to 24-4 such as integrated circuit (IC) elements are mounted on the surface of the semiconductor substrate 21 opposite to the surface on which the image sensor 22 and the antenna unit 23 are provided. Note that, hereinafter, in a case where it is not necessary to particularly distinguish the elements 24-1 to 24-4 from each other, the elements are also simply referred to as elements 24.

For example, each element 24 is electrically connected to another element 24 by the wiring layer 33 or the like serving as an IC layer, or is electrically connected to the image sensor 22 or the antenna unit 23 via the semiconductor substrate 21.

Note that, hereinafter, the surface of the semiconductor substrate 21 on the side where the image sensor 22 and the antenna unit 23 are provided is also referred to as the light incident side surface, and the surface of the semiconductor substrate 21 on the side where the elements 24 are provided is also referred to as the back surface.

In the sensor module 11, for example, a camera is realized by the image sensor 22, the elements 24, and the like provided on the left half side in the drawing of the portion indicated by the arrow Q11, and a millimeter wave radar is realized by the antenna unit 23, the elements 24, and the like provided on the right half side in the drawing. In other words, a camera and a millimeter wave radar are mounted on the sensor module 11.

For example, in the portion indicated by the arrow Q11, light from a subject enters the image sensor 22 from the upper side in the drawing via the cover glass 42.

The image sensor 22 receives and photoelectrically converts light incident from a subject, thereby imaging a video (a still image or a moving image) with the front of the sensor module 11 as the subject.

Furthermore, in the portion indicated by the arrow Q11, the antenna unit 23 emits (transmits) a millimeter wave (radio wave in a millimeter wave band) to the upper side of the transmission patch antennas in the drawing, that is, to the front of the sensor module 11. Furthermore, the antenna unit 23 receives, by the reception patch antennas, the millimeter wave reflected by an object in front of the sensor module 11 and returned from the upper side in the drawing. By receiving the millimeter wave reflected by the object in this manner, the position of the object in front of the sensor module 11, that is, the distance from the sensor module 11 to the object, the speed of the object, and the like can be measured.

In such sensor module 11 as described above, the image sensor 22 and the antenna unit 23 of the millimeter wave radar are provided at positions close to each other on the same surface of the same semiconductor substrate 21, and the relative positional relationship between the image sensor 22 and the antenna unit 23 is substantially unchanged.

Therefore, according to the sensor module 11, calibration of the positional relationship between the image sensor 22 and the antenna unit 23 can be simplified (facilitated), and in some cases, the calibration is not necessary.

Furthermore, since the disposed positions of the image sensor 22 and the antenna unit 23 are close to each other, it is possible to reduce the deviation between an angle of view of the image sensor 22, that is, a region to be imaged and a region where a millimeter wave is emitted by the antenna unit 23 in front of the sensor module 11. As a result, the position (distance), speed, and the like can be measured with high accuracy.

Moreover, the image sensor 22 is disposed in a space surrounded by the semiconductor substrate 21, the frame 41, and the cover glass 42, and the antenna unit 23 is disposed outside that space. In other words, the entire image sensor 22 including the light receiving surface and the antenna unit 23, that is, the antenna surface (emission surface) of the millimeter wave antenna are disposed at spatially partitioned positions (spatially separated positions).

Therefore, in the sensor module 11, favorable characteristics can be obtained for imaging by the image sensor 22 and measurement by the millimeter wave radar including the antenna unit 23. In other words, a higher-quality video and a higher-accuracy measurement result can be obtained.

Specifically, for example, since the image sensor 22 is surrounded by the frame 41 and the cover glass 42, it is less likely to be affected by a millimeter wave emitted from the antenna unit 23 as compared with a case where the image sensor 22 and the antenna unit 23 are disposed at positions that are not spatially partitioned. Therefore, in the image sensor 22, noise caused by a millimeter wave can be reduced, and a higher-quality video can be obtained.

Furthermore, for example, in the sensor module 11, the antenna unit 23 is not surrounded by the frame 41, the cover glass 42, or the like. That is, there is no structure of the sensor module 11 that blocks a millimeter wave at the time of emission or reception in front of the antenna unit 23.

Therefore, it is possible to irradiate an object in front with a millimeter wave with stronger intensity and receive the millimeter wave reflected by the object with stronger intensity, and as a result, the position, speed, and the like can be measured with higher accuracy.

As described above, according to the sensor module 11 of the present technology, it is possible to facilitate calibration and obtain favorable characteristics.

Second Embodiment

<Configuration Example of Sensor Module>

Next, other embodiments to which the present technology is applied will be described with reference to FIGS. 2 to 13. Note that, in FIGS. 2 to 13, same reference sign is assigned to a portion corresponding to that in the case of FIG. 1, and description thereof will be omitted as appropriate. Furthermore, in FIGS. 2 to 13, same reference sign is assigned to portions corresponding to each other, and description thereof will be omitted as appropriate.

In the example illustrated in FIG. 1, since there is no structure related to the sensor module 11 in front of the antenna unit 23, that is, right in front of the antenna unit 23, favorable characteristics can be obtained regarding measurement of the position, speed, and the like by a millimeter wave.

However, in the example of FIG. 1, the frame 41 and the cover glass 42 are provided as the structures of the sensor module 11, more specifically, the structures related to the image sensor 22, in the diagonally forward left direction of the antenna unit 23.

Therefore, depending on the positional relationship between the antenna unit 23 and the frame 41 and the cover glass 42, there is a possibility that interference occurs due to reflection of a millimeter wave (radio wave) for measurement by the frame 41 or the cover glass 42 or other causes.

Therefore, by taking a configuration in which the antenna unit of the millimeter wave radar (emission surface of a millimeter wave) is located before (in front of) the structures related to the image sensor 22 such as the frame 41 and the cover glass 42 in the emission direction of a millimeter wave, characteristics related to measurement such as position and speed may be further improved.

Figure 2:
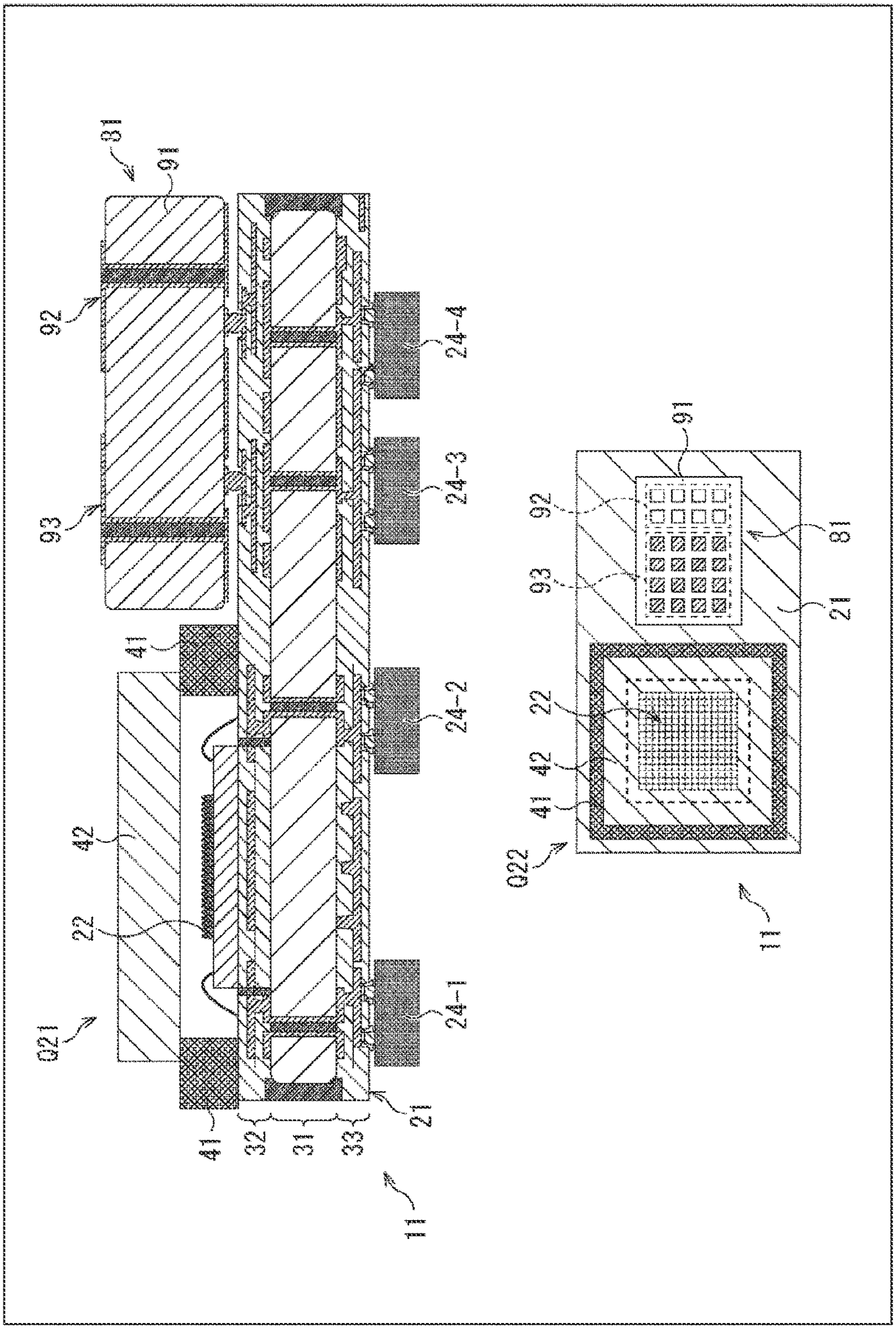
FIG. 2 is a diagram illustrating another configuration example of the sensor module.

In such a case, for example, the sensor module 11 is configured as illustrated in FIG. 2.

The configuration of the sensor module 11 illustrated in FIG. 2 is different from the sensor module 11 in FIG. 1 in that an antenna unit 81 is provided instead of the antenna unit 23, and is the same as the configuration of the sensor module 11 in FIG. 1 in other respects.

In FIG. 2, similarly to the case in FIG. 1, a cross section of the sensor module 11 is illustrated in a portion indicated by an arrow Q21, and a drawing of the sensor module 11 as viewed from above is illustrated in a portion indicated by an arrow Q22.

In the sensor module 11 illustrated in FIG. 2, the image sensor 22 and the antenna unit 81 of the millimeter wave radar are mounted on the light incident side surface of the semiconductor substrate 21.

The antenna unit 81 is a mounted antenna mounted on the semiconductor substrate 21, and includes an antenna substrate 91, a transmission antenna unit 92, and a reception antenna unit 93.

For example, the antenna substrate 91 is mounted on the surface of the semiconductor substrate 21, more specifically, the wiring layer 32 by solder or the like.

Furthermore, the transmission antenna unit 92 including a plurality of transmission (oscillation) patch antennas and the reception antenna unit 93 including a plurality of reception patch antennas are formed on the surface of the antenna substrate 91 opposite to the semiconductor substrate 21 side.

The transmission antenna unit 92 and the reception antenna unit 93 correspond to the transmission antenna unit 51 and the reception antenna unit 52 illustrated in FIG. 1. In this example, the surface on which the transmission antenna unit 92 and the reception antenna unit 93 are disposed is the antenna surface of the millimeter wave antenna.

Furthermore, each patch antenna constituting the transmission antenna unit 92 is electrically connected to the semiconductor substrate 21 and the elements 24 by a through hole or the like formed in the antenna substrate 91.

Similarly, each patch antenna constituting the reception antenna unit 93 is electrically connected to the semiconductor substrate 21 and the elements 24 by the through hole or the like formed in the antenna substrate 91.

Therefore, the transmission antenna unit 92 emits a millimeter wave on the basis of a signal supplied from the semiconductor substrate 21 via the through hole or the like of the antenna substrate 91. Furthermore, a signal corresponding to the millimeter wave received by the reception antenna unit 93 is supplied from the reception antenna unit 93 to the semiconductor substrate 21 via the through hole or the like of the antenna substrate 91.

Note that, although the emission surface of the antenna unit 81 is the surface on which the transmission antenna unit 92 and the reception antenna unit 93 are formed, the entire antenna unit 81 including the antenna substrate 91 functions as the antenna of the millimeter wave radar.

Furthermore, the portion indicated by the arrow Q22 illustrates the disposition of the image sensor 22 and the antenna unit 81 on the semiconductor substrate 21 when the sensor module 11 is viewed from above in the downward direction in the drawing of the portion indicated by the arrow Q21.

In this example, the transmission antenna unit 92 and the reception antenna unit 93, that is, the transmission patch antennas and the reception patch antennas are formed on the same plane of the antenna substrate 91. Furthermore, the sensor module 11 has a single-patch antenna configuration in which emission and reception of a millimeter wave are performed by a plurality of patch antennas (the antenna unit 81) formed on such one plane.

In such sensor module 11 as described above, in the direction perpendicular to the surface of the semiconductor substrate 21, the transmission antenna unit 92 and the reception antenna unit 93, that is, the antenna surface of the antenna unit 81 is disposed at a higher position than the structure related to the image sensor 22 (the cover glass 42) (a position further away from the semiconductor substrate 21) when viewed from the semiconductor substrate 21.

In other words, in the emission direction of a millimeter wave emitted from the antenna unit 81, the antenna surface (emission surface) of the antenna unit 81 is located before (in front of) the image sensor 22 and the structure related to the image sensor 22.

Therefore, it is possible to suppress the occurrence of interference (reduce interference) due to reflection of a millimeter wave (radio wave) for measurement by the structures related to the image sensor 22 such as the cover glass 42, and to further improve characteristics related to measurement such as position and speed.

Furthermore, it has been empirically found that the band of an antenna, that is, the band (bandwidth) of a millimeter wave to be emitted is closely related to the volume of a portion functioning as the antenna.

Since the antenna unit 81 is a mounted antenna, the antenna volume can be increased without increasing the thickness of the semiconductor substrate 21, and a sufficiently wide band can be secured. In other words, a wider band of the antenna can be achieved.

Moreover, since it is not necessary to form all the antennas on the semiconductor substrate 21 where the thickness (volume) cannot be increased, it is not necessary to provide a useless interlayer film or the like in the wiring layer 33, which is an IC layer opposite to the mounting side of the antenna unit 81, in order to take measures against warpage and make the upper and lower wiring layers symmetrical, that is, have the same thickness. Therefore, reflection of a signal corresponding to a millimeter wave at the time of emission or reception in a via, a stub, or the like provided in the semiconductor substrate 21 can be reduced, and RF characteristics (high-frequency characteristics) can be improved.

Third Embodiment

<Configuration Example of Sensor Module>

Furthermore, although an example of a single-patch antenna configuration has been described above, a double-patch antenna configuration may be employed so that the band of the antenna can be expanded (widened).

Figure 3:
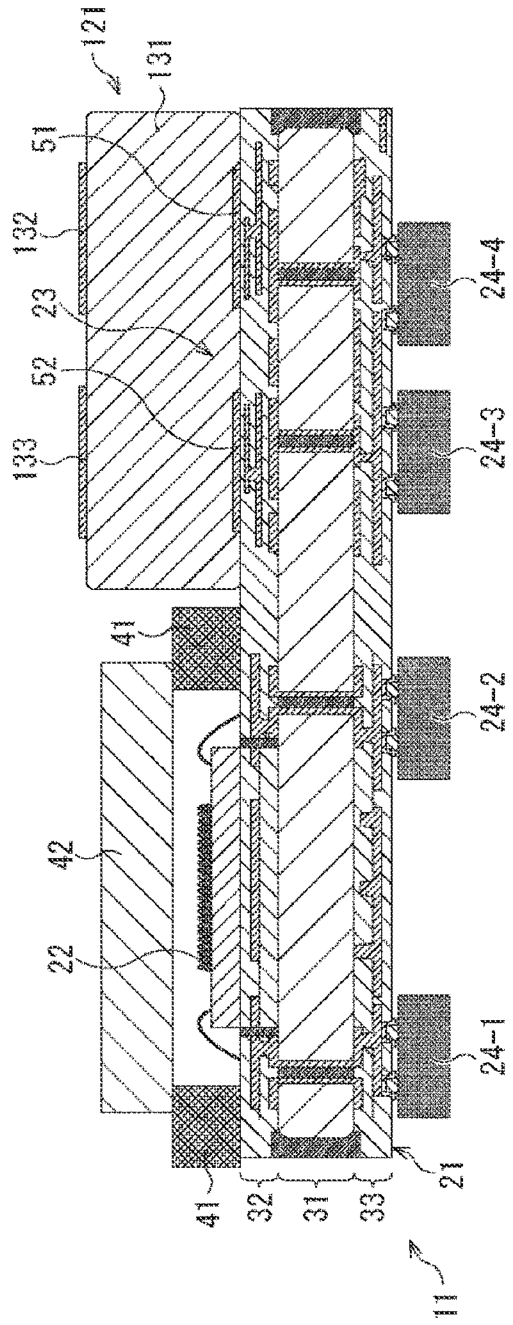
FIG. 3 is a diagram illustrating another configuration example of the sensor module.

In such a case, for example, the sensor module 11 is configured as illustrated in FIG. 3.

The configuration of the sensor module 11 illustrated in FIG. 3 is a configuration in which an antenna unit 121 is further provided in the configuration of the sensor module 11 in FIG. 1.

That is, in the example of FIG. 3, the image sensor 22, and the antenna unit 23 and the antenna unit 121 of the millimeter wave radar are provided on the light incident side surface of the semiconductor substrate 21. Furthermore, the image sensor 22, and the antenna unit 23 and the antenna unit 121 are disposed at spatially partitioned positions.

In particular, the antenna unit 121 is a mounted antenna mounted by adhesion or the like at a position immediately above the antenna unit 23 on the semiconductor substrate 21, and the portion including the antenna unit 23 and the antenna unit 121 functions as one millimeter wave antenna.

The antenna unit 121 includes an antenna substrate 131, a transmission antenna unit 132, and a reception antenna unit 133.

For example, the antenna substrate 131 includes glass or the like, and is disposed on the semiconductor substrate 21 such that the transmission antenna unit 51 and the reception antenna unit 52 are covered with the antenna substrate 131. That is, the antenna substrate 131 is disposed at a position immediately above the antenna unit 23. Note that, here, unlike the case in FIG. 1, the transmission antenna unit 51 and the reception antenna unit 52 are disposed away from each other. However, the transmission antenna unit 51 and the reception antenna unit 52 may be disposed adjacent to each other.

Furthermore, the transmission antenna unit 132 including a plurality of transmission (oscillation) patch antennas is formed at a position facing the transmission antenna unit 51 on the surface of the antenna substrate 131 opposite to the semiconductor substrate 21.

In other words, the antenna substrate 131 is disposed between the transmission antenna unit 51 and the transmission antenna unit 132 disposed to face each other.

Similarly, the reception antenna unit 133 including a plurality of reception patch antennas is formed at a position facing the reception antenna unit 52 on the surface of the antenna substrate 131 opposite to the semiconductor substrate 21.

The antenna surface (emission surface) of the antenna unit 121 is a plane on which the transmission antenna unit 132 and the reception antenna unit 133 are disposed.

Similarly to the case in FIG. 2, the antenna surface of the antenna unit 121 is located before the structure related to the image sensor 22 (cover glass 42) in the emission direction of a millimeter wave. That is, in the direction perpendicular to the surface of the semiconductor substrate 21, the antenna surface of the antenna unit 121 is disposed at a position further away (farther) from the semiconductor substrate 21 than the structure related to the image sensor 22.

Therefore, interference of a millimeter wave for measurement caused by the structures related to the image sensor 22 such as the cover glass 42 can be reduced.

Furthermore, the antenna surface of the antenna unit 121 is at a position different from the surface on which the antenna unit 23 is disposed. That is, the transmission antenna unit 51 and the reception antenna unit 52, and the transmission antenna unit 132 and the reception antenna unit 133 are not disposed on the same plane.

As described above, the sensor module 11 in FIG. 3 has a double-patch antenna configuration including two antennas at different disposed positions in the emission direction of a millimeter wave (direction perpendicular to the semiconductor substrate 21).

For example, at the time of emission of a millimeter wave, when a signal corresponding to the millimeter wave is supplied to the transmission antenna unit 51, the millimeter wave is emitted from the transmission antenna unit 51 and the transmission antenna unit 132 in a state where the transmission antenna unit 51 and the transmission antenna unit 132 are electromagnetically coupled. That is, the signal supplied to the transmission antenna unit 51 is supplied to the transmission antenna unit 132 via the antenna substrate 131, and the millimeter wave corresponding to the signal is output by the transmission antenna unit 132.

Furthermore, at the time of reception of a millimeter wave, a signal (millimeter wave) received by the reception antenna unit 133 is supplied from the reception antenna unit 133 to the reception antenna unit 52 via the antenna substrate 131 in a state where the reception antenna unit 52 and the reception antenna unit 133 are electromagnetically coupled.

With such a double-patch antenna configuration as described above, a wider band of the antenna can be achieved and RF characteristics can be improved.

Fourth Embodiment

<Configuration Example of Sensor Module>

Furthermore, in the case of a double-patch antenna configuration, the band of the antenna can be further expanded by introducing an air layer between patch antennas arranged in the emission direction of a millimeter wave.

Figure 4:
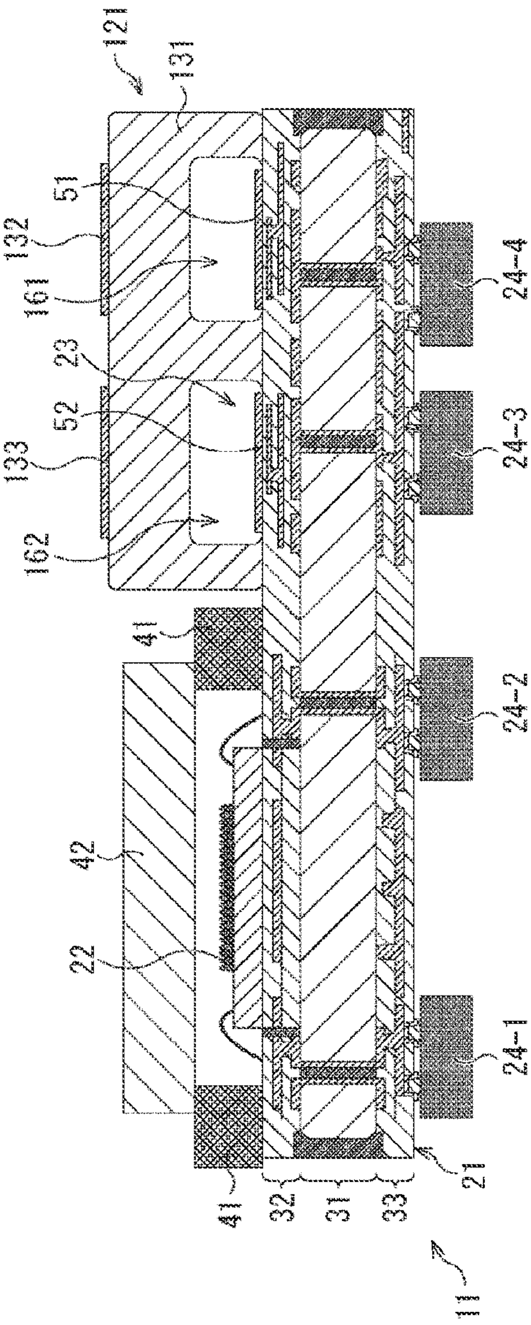
FIG. 4 is a diagram illustrating another configuration example of the sensor module.

In such a case, for example, the sensor module 11 is configured as illustrated in FIG. 4.

The configuration of the sensor module 11 illustrated in FIG. 4 is basically the same as the configuration of the sensor module 11 in FIG. 3. However, in the sensor module 11 in FIG. 4, the portion immediately below the transmission antenna unit 132 and the portion immediately below the reception antenna unit 133 in the antenna substrate 131 have a recess shape.

Therefore, in the antenna unit 121, an air layer 161, that is, a gap is formed between the transmission antenna unit 51 and the transmission antenna unit 132. Similarly, an air layer 162 (gap) is formed between the reception antenna unit 52 and the reception antenna unit 133.

By forming such air layers, the average dielectric constant between the transmission antenna unit 51 and the transmission antenna unit 132 and the average dielectric constant between the reception antenna unit 52 and the reception antenna unit 133 are lower than those in the example of FIG. 3.

As a result, a further wider band of the antenna can be achieved and the gain of the antenna (millimeter wave), that is, the signal intensity can be further increased.

Furthermore, also in the example illustrated in FIG. 4, since the antenna surface of the antenna unit 121 is located in front of the structures related to the image sensor 22, interference of a millimeter wave can be reduced.

Fifth Embodiment

<Configuration Example of Sensor Module>

Note that, in the examples described above, since the antenna of the millimeter wave radar and the image sensor 22 are disposed adjacent to each other, there is a possibility that the image sensor 22 is affected by unnecessary emission from the antenna.

Figure 5:
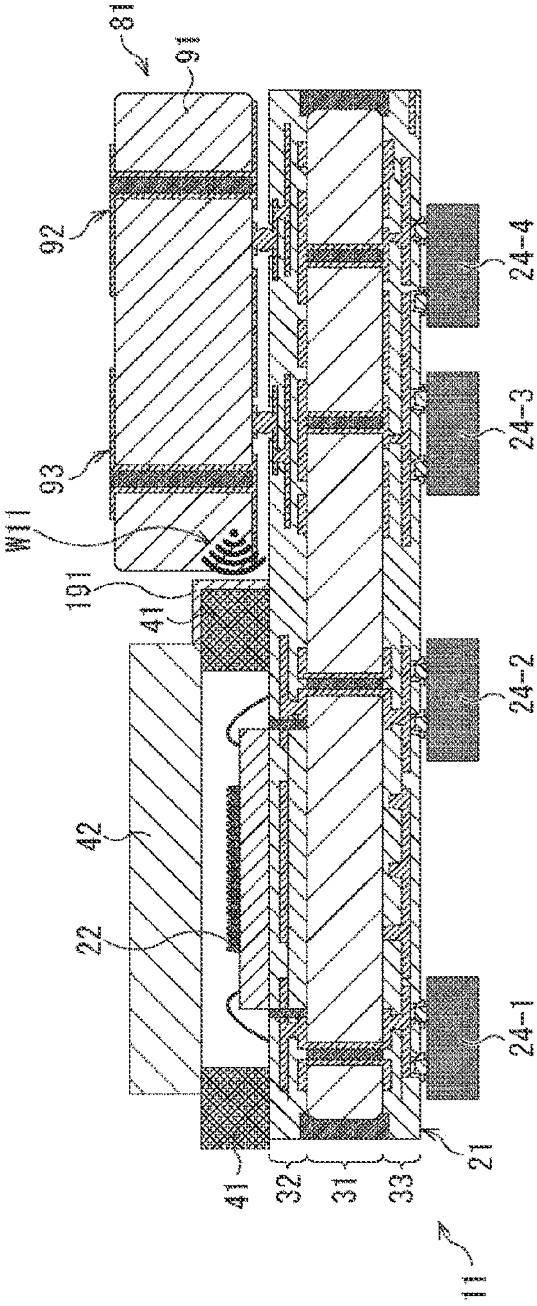
FIG. 5 is a diagram illustrating another configuration example of the sensor module.

Therefore, for example, as illustrated in FIG. 5, a conductive substance may be used to reduce the influence of unnecessary emission.

The configuration of the sensor module 11 illustrated in FIG. 5 is a configuration in which a conductive substance 191 is further provided in the configuration of the sensor module 11 in FIG. 2. Note that, here, an example will be described in which the conductive substance 191 is provided in the sensor module 11 illustrated in FIG. 2, but without being limited to this example, the conductive substance 191 may be further provided in the sensor module 11 illustrated in FIGS. 3 and 4 as well.

In the example illustrated in FIG. 5, for example, as indicated by an arrow W11, unnecessary emission (unnecessary emission of a millimeter wave) from the antenna unit 81 toward the image sensor 22 may occur.

Therefore, in this example, a conductive substance is applied to the surface on the antenna unit 81 side in a structure on the semiconductor substrate 21 between the antenna unit 81 and the image sensor 22.

Specifically, the conductive substance 191 is applied to the side surface (surface) of a portion of the frame 41 between the antenna unit 81 and the image sensor 22.

Furthermore, the conductive substance 191 is electrically connected to a ground (GND) for analog power supply (for an analog circuit), that is, an analog ground provided on the semiconductor substrate 21.

By providing such conductive substance 191, unnecessary emission from the antenna unit 81 is absorbed by the conductive substance 191 and discharged to the analog ground. This can reduce the influence of unnecessary emission from the antenna unit 81 received by the image sensor 22. That is, noise or the like can be reduced, and a higher-quality video can be obtained.

Note that, in each example described above, an analog ground for the image sensor 22 and a millimeter wave reflection analog ground for a millimeter wave radar, that is, a millimeter wave transmitted and received by a millimeter wave radar are provided in the wiring layer 32 or the wiring layer 33 of the semiconductor substrate 21.

Therefore, the analog ground for the image sensor 22 (image sensor analog ground) and the millimeter wave reflection analog ground may be made common. That is, one and the same analog ground provided on the semiconductor substrate 21 may be used (caused to function) as both the analog ground for the image sensor 22 and the millimeter wave reflection analog ground.

By doing so, the area of the analog ground can be further increased, and thus, it is possible to reduce the fluctuation of the power supply on the image sensor 22 (camera) side.

Note that, for example, an analog ground having a large area called a so-called solid pattern may be provided at a position in the wiring layer 32 or the wiring layer 33 between the image sensor 22 and an antenna of a millimeter wave radar such as the antenna unit 23, when the sensor module 11 is viewed from a direction parallel to the surface of the semiconductor substrate 21.

In such a case, a solid pattern (analog ground) provided between the image sensor 22 and the antenna of the millimeter wave radar is used as both the analog ground for the image sensor 22 and the millimeter wave reflection analog ground. That is, the same analog ground is shared by the camera and the millimeter wave radar.

Furthermore, for example, some of the plurality of elements 24 provided in the sensor module 11 are low dropout (LDO) ICs for digital power supply (digital circuit) or analog power supply (analog circuit), that is, low-dropout regulators or DC/DC converters. It can be said that these LDO ICs and DC/DC converters function as analog or digital power supplies.

Such elements 24 as power supply circuits such as analog or digital power supplies, that is, LDO ICs or DC/DC converters may be made common (shared) by the image sensor 22 (camera) and the millimeter wave radar. That is, the same elements 24 may be used (caused to function) as both a power supply for the camera (for the image sensor 22) and a power supply for the millimeter wave radar.

By doing so, power consumption in the sensor module 11 can be further reduced as compared with a case where power sources are separately provided for the camera and the millimeter wave radar.

Sixth Embodiment

<Configuration Example of Sensor Module>

Moreover, a frame member for reinforcement may be provided in the configuration of the sensor module 11 illustrated in FIG. 1 so as to improve strength.

For example, in a single-patch antenna configuration in which patch antennas are formed on the semiconductor substrate 21 by patterning as in the example illustrated in FIG. 1, the semiconductor substrate 21 may be warped due to temperature or the like.

Therefore, a frame member for reinforcing the semiconductor substrate 21 may be provided, the frame member including through-holes for exposing each of a plurality of patch antennas as exposing portions.

Figure 6:
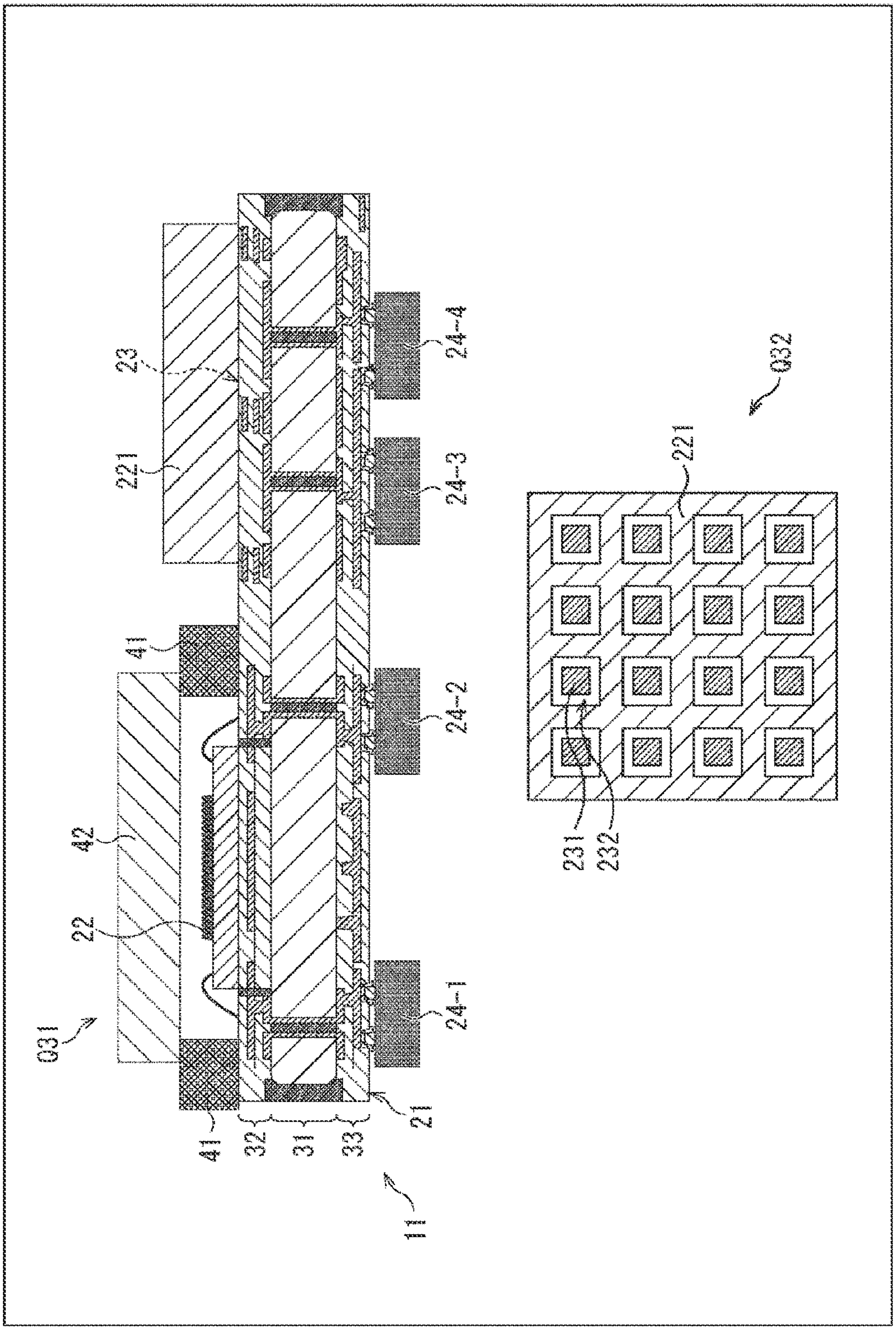
FIG. 6 is a diagram illustrating another configuration example of the sensor module.

In such a case, for example, the sensor module 11 is configured as illustrated in FIG. 6.

The configuration of the sensor module 11 illustrated in FIG. 6 is a configuration in which a frame member 221 is further provided in the configuration of the sensor module 11 in FIG. 1.

In FIG. 6, a cross section of the sensor module 11 is illustrated in the portion indicated by an arrow Q31, and a drawing of the frame member 221 as viewed from above is illustrated in the portion indicated by an arrow Q32.

In the portion indicated by the arrow Q31, the frame member 221 for reinforcement including a conductor or a non-conductor is disposed immediately above the antenna unit 23 on the semiconductor substrate 21.

By providing such frame member 221, the occurrence of warpage of the semiconductor substrate 21 due to temperature or the like, that is, warping fluctuation of the semiconductor substrate 21 can be reduced. As a result, it is possible to obtain favorable characteristics regarding imaging by the image sensor 22 and measurement by the millimeter wave radar.

Furthermore, the frame member 221 may have conductivity, and the frame member 221 may be electrically connected to an analog ground provided on the semiconductor substrate 21. By doing so, similarly to the example of FIG. 5, the influence of unnecessary emission from the antenna unit 23 received by the image sensor 22 can be reduced.

Moreover, as indicated by an arrow Q32, in portions of the frame member 221 immediately above each patch antenna of the antenna unit 23, through-holes for exposing the patch antennas, that is, the antenna surface are provided as exposing portions.

For example, here, one through-hole having a square shape is provided as an exposing portion 232 for exposing one patch antenna 231 in the frame member 221, when the frame member 221 is viewed from the direction perpendicular to the surface of the semiconductor substrate 21 (above). That is, the patch antenna 231 is surrounded by the wall surface of the frame member 221 forming the exposing portion 232, whereby the patch antenna 231 is in a state of being exposed.

Therefore, since there is no member forming the frame member 221 between the patch antenna 231 and an object of which position and speed are to be measured in front of the patch antenna 231, a millimeter wave is not shielded by the frame member 221.

Note that, here, in order to make the drawing easy to see, the transmission patch antennas and the reception patch antennas constituting the antenna unit 23 are not distinguished from each other, and one shaded (hatched) square is drawn as one patch antenna, and the number of drawn patch antennas is small. This applies similarly to FIGS. 7 and 8 to be described later.

Furthermore, in FIG. 6, only one patch antenna of a plurality of patch antennas is assigned a reference sign. However, hereinafter, an arbitrary transmission or reception patch antenna constituting the antenna unit 23 is also referred to as the patch antenna 231.

Similarly, only one exposing portion of a plurality of exposing portions provided in the frame member 221 is assigned a reference sign. However, hereinafter, an arbitrary exposing portion provided in the frame member 221 is also referred to as the exposing portion 232.

In this example, one exposing portion 232 having a square shape is provided for one patch antenna 231.

That is, in a case where the frame member 221 is viewed from the direction perpendicular to the surface of the semiconductor substrate 21, the frame member 221 is provided with a plurality of exposing portions 232 regularly arranged in the vertical direction and horizontal direction perpendicular to each other. In other words, the frame member 221 is provided with the plurality of exposing portions 232 in a lattice form. Note that one exposing portion 232 may be provided for a plurality of patch antennas 231.

Since such a frame member 221 having a lattice shape is known to have strong strength, warping fluctuation of the semiconductor substrate 21 can be reduced by providing the frame member 221 immediately above the antenna unit 23 on the semiconductor substrate 21.

<Modification of Sixth Embodiment>

<Configuration Example of Frame Member>

Note that the number and shape of exposing portions provided in the frame member 221 are not limited to the example illustrated in FIG. 6, and may be any number and shape.

Figure 7:
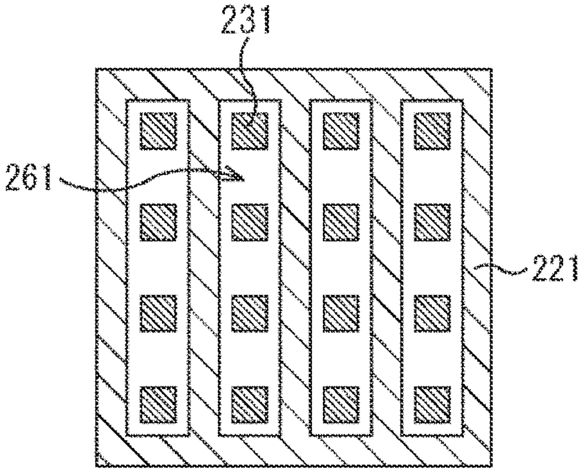
FIG. 7 is a diagram illustrating another example of an exposing portion provided in a frame member.

For example, as illustrated in FIG. 7, one through-hole surrounding a plurality of patch antennas 231 may be one exposing portion 261.

Note that FIG. 7 is a diagram in which the portion of the frame member 221 of the sensor module 11 is viewed from the direction perpendicular to the surface of the semiconductor substrate 21. Furthermore, here, only one exposing portion of the plurality of exposing portions provided in the frame member 221 is assigned a reference sign. However, hereinafter, an arbitrary exposing portion provided in the frame member 221 is also referred to as the exposing portion 261.

In this example, in the frame member 221, a plurality of exposing portions 261 having a rectangular shape long in the longitudinal direction in the drawing is provided by being arranged in the lateral direction (direction perpendicular to the longitudinal direction) in the drawing, that is, in the short-length direction of the exposing portions 261.

In other words, the frame member 221 is a frame having a bamboo-blind shape in which the plurality of exposing portions 261 is formed like a bamboo-blind. Note that such a bamboo-blind shape can also be said to be one (an example) of lattice shapes.

In FIG. 7, four patch antennas 231 arranged in the longitudinal direction in the drawing are surrounded by the wall surface of the frame member 221 forming one exposing portion 261. As a result, four patch antennas 231 are in a state of being exposed in the portion of one exposing portion 261.

Since such a frame having a bamboo-blind shape is also known to have strong strength, warping fluctuation of the semiconductor substrate 21 can be reduced also by providing the frame member 221 having the bamboo-blind shape illustrated in FIG. 7 immediately above the antenna unit 23 on the semiconductor substrate 21.

Figure 8:
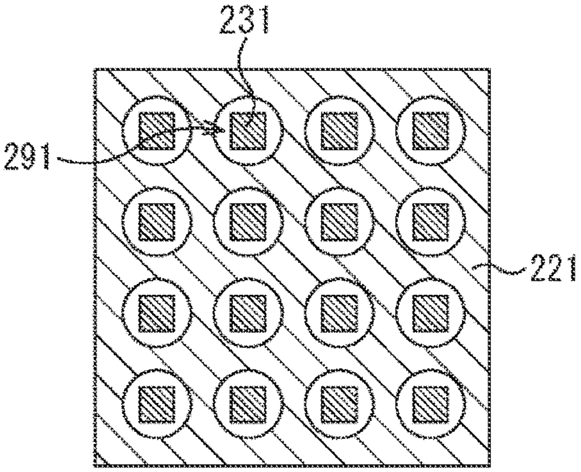
FIG. 8 is a diagram illustrating another example of the exposing portion provided in the frame member.

Furthermore, for example, as illustrated in FIG. 8, one through-hole having a circular shape (cylindrical shape) surrounding one patch antenna 231 may be one exposing portion 291.

Note that FIG. 8 is a diagram in which the portion of the frame member 221 of the sensor module 11 is viewed from the direction perpendicular to the surface of the semiconductor substrate 21. Furthermore, here, only one exposing portion of the plurality of exposing portions provided in the frame member 221 is assigned a reference sign. However, hereinafter, an arbitrary exposing portion provided in the frame member 221 is also referred to as the exposing portion 291.

In this example, in the frame member 221, a plurality of exposing portions 291 having a circular shape is formed to be regularly arranged in the longitudinal direction and lateral direction in the drawing when viewed from the direction perpendicular to the surface of the semiconductor substrate 21.

Specifically, one patch antenna 231 is surrounded by the wall surface of the frame member 221 forming one exposing portion 291. Therefore, one patch antenna 231 is in a state of being exposed in the portion of one exposing portion 291.

Since such a structure in which a plurality of exposing portions 291 having a circular shape is provided is known to have stronger strength than the above-described bamboo-blind shape or lattice shape, warping fluctuation of the semiconductor substrate 21 can be reduced also by providing the frame member 221 having the shape illustrated in FIG. 8 immediately above the antenna unit 23 on the semiconductor substrate 21.

Note that, as described with reference to FIGS. 6 to 8, the shape of an exposing portion that exposes the patch antenna 231 can be any shape. Furthermore, the shape of emission of a millimeter wave (radio wave) emitted from the patch antenna 231 changes depending on the shape of an exposing portion.

Therefore, the shape of emission of a millimeter wave emitted from the patch antenna 231 may be adjusted by adjusting the shape of an exposing portion.

Seventh Embodiment

<Configuration Example of Sensor Module>

Furthermore, for example, in the case of a double-patch antenna configuration as in the example illustrated in FIG. 4, an antenna substrate that also functions as an antenna may also be used as a member that spatially partitions the image sensor 22. That is, one member may be shared as the cover glass and frame of the image sensor 22, and an antenna substrate of a mounted antenna.

Figure 9:
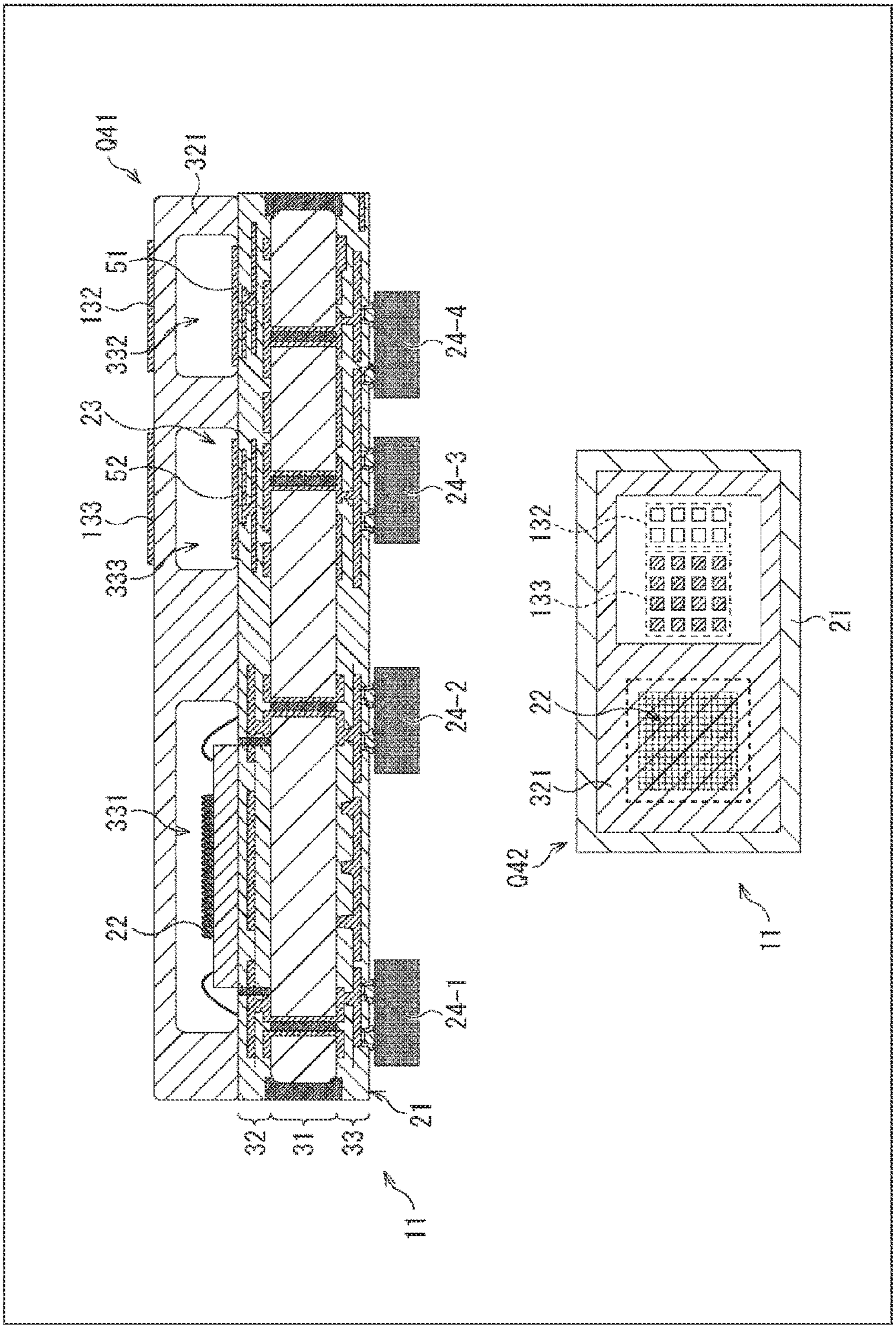
FIG. 9 is a diagram illustrating another configuration example of the sensor module.

In such a case, for example, the sensor module 11 is configured as illustrated in FIG. 9.

The configuration of the sensor module 11 illustrated in FIG. 9 is a configuration in which an antenna substrate 321 is newly provided instead of the frame 41, the cover glass 42, and the antenna substrate 131 of the sensor module 11 illustrated in FIG. 4.

In FIG. 9, a cross section of the sensor module 11 is illustrated in a portion indicated by an arrow Q41, and a drawing of the sensor module 11 as viewed from above is illustrated in a portion indicated by an arrow Q42.

As indicated by the arrow Q41, in this example, the antenna substrate 321 is mounted on the light incident side surface of the semiconductor substrate 21 by adhesion or the like.

For example, the antenna substrate 321 includes a member such as glass based on Si (silicon) and O (oxygen), that is, containing Si and O as main raw materials.

Furthermore, a portion immediately above each of the image sensor 22, the transmission antenna unit 51, and the reception antenna unit 52 in the antenna substrate 321 has a recess shape, and an air layer 331, an air layer 332, and an air layer 333, which are gaps, are formed.

That is, the image sensor 22 is disposed in a space surrounded by the antenna substrate 321 and the semiconductor substrate 21, and this space is the air layer 331.

In this case, the portion of the antenna substrate 321 surrounding the periphery of the image sensor 22 functions as the cover glass (protective member) and frame.

Similarly, the transmission antenna unit 51 is disposed in a space surrounded by the antenna substrate 321 and the semiconductor substrate 21, that is, in the air layer 332, and the reception antenna unit 52 is disposed in a space surrounded by the antenna substrate 321 and the semiconductor substrate 21, that is, in the air layer 333.

Therefore, the entire image sensor 22 including the light receiving surface, and the transmission antenna unit 51, the reception antenna unit 52, the transmission antenna unit 132, and the reception antenna unit 133 constituting the antenna of the millimeter wave radar are spatially partitioned (separated).

Therefore, also in the sensor module 11 illustrated in FIG. 9, similarly to the case in FIG. 1, noise caused by a millimeter wave in the image sensor 22 can be reduced, and a higher-quality video can be obtained.

Furthermore, similarly to the example in FIG. 4, not only the portions of the transmission antenna unit 132 and the reception antenna unit 133 but also the portion of the antenna substrate 321 functions as a part of the antenna.

In the sensor module 11, emission and reception of a millimeter wave are performed in a state where the transmission antenna unit 51 and the transmission antenna unit 132 are electromagnetically coupled, and the reception antenna unit 52 and the reception antenna unit 133 are electromagnetically coupled.

That is, a signal supplied to the transmission antenna unit 51 is supplied to the transmission antenna unit 132 via the air layer 332 and the antenna substrate 321, and a millimeter wave corresponding to the signal is output by the transmission antenna unit 132. Furthermore, a signal (millimeter wave) received by the reception antenna unit 133 is supplied from the reception antenna unit 133 to the reception antenna unit 52 via the antenna substrate 321 and the air layer 333.

In this case, the plane on which the transmission antenna unit 132 and the reception antenna unit 133 are disposed is the antenna surface of a millimeter wave, and, similarly to the case in FIG. 2, the antenna surface is located before the structures related to the image sensor 22 in the emission direction of a millimeter wave. Therefore, interference of a millimeter wave for measurement caused by the structures related to the image sensor 22 can be reduced.

Furthermore, in this example, since the air layer 332 and the air layer 333 serving as gaps are provided, similarly to the example illustrated in FIG. 4, the average dielectric constant can be lowered, and a further wider band of the antenna can be achieved and the gain of the antenna (millimeter wave) can be further increased.

Moreover, as indicated by the arrow Q42, the antenna substrate 321 is a member having a frame structure disposed to cover the entire portion of the image sensor 22 and the antenna unit 23 on the semiconductor substrate 21. Therefore, similarly to the examples illustrated in FIG. 6 and the like, the antenna substrate 321 also functions as a frame member for reinforcement, and can reduce warping fluctuation of the semiconductor substrate 21.

<Modification of Seventh Embodiment>

<Configuration Example of Sensor Module>

Note that, in FIG. 9, an example in which the air layer 332 and the air layer 333 are provided around the transmission antenna unit 51 and the reception antenna unit 52 has been described. However, there may be a case in which the air layer 332 and the air layer 333 are not provided.

Figure 10:
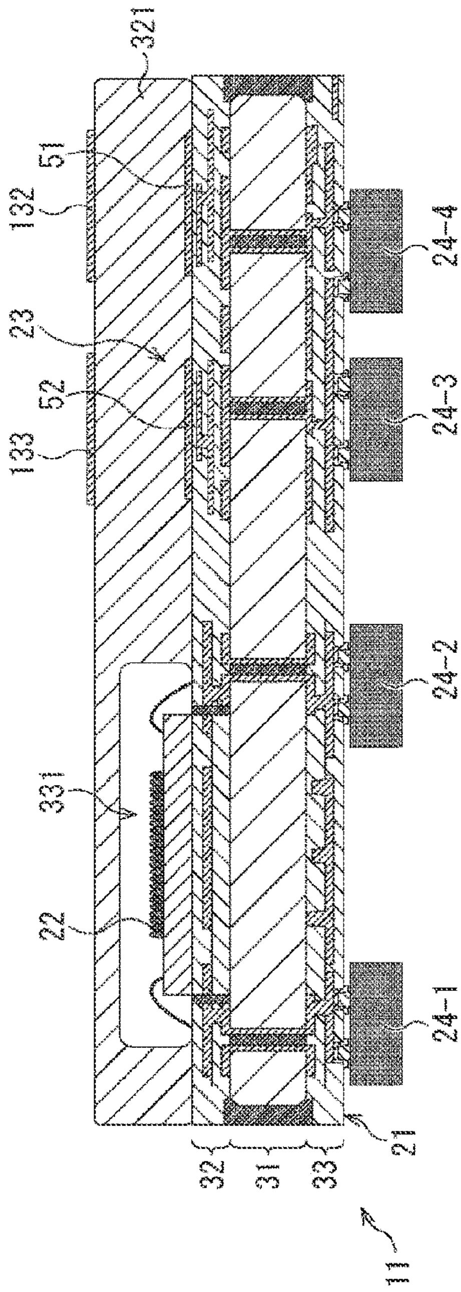
FIG. 10 is a diagram illustrating another configuration example of the sensor module.

In such a case, for example, the sensor module 11 is configured as illustrated in FIG. 10.

The configuration of the sensor module 11 illustrated in FIG. 10 is basically the same as the configuration of the sensor module 11 illustrated in FIG. 9, and is different from the configuration of the sensor module 11 illustrated in FIG. 9 only in that the air layer 332 and the air layer 333 are not provided.

In this case, as compared with the example of FIG. 9, since the band of the antenna is narrowed by the absence of the gaps, but the area where the antenna substrate 321 and the semiconductor substrate 21 are in contact with each other is increased, warping fluctuation of the semiconductor substrate 21 can be further reduced.

Eighth Embodiment

<Configuration Example of Sensor Module>

Furthermore, in the case where the analog ground for the image sensor 22 and the millimeter wave reflection analog ground are made common as described above, the shared analog ground may be used as a heat spreader.

Figure 11:
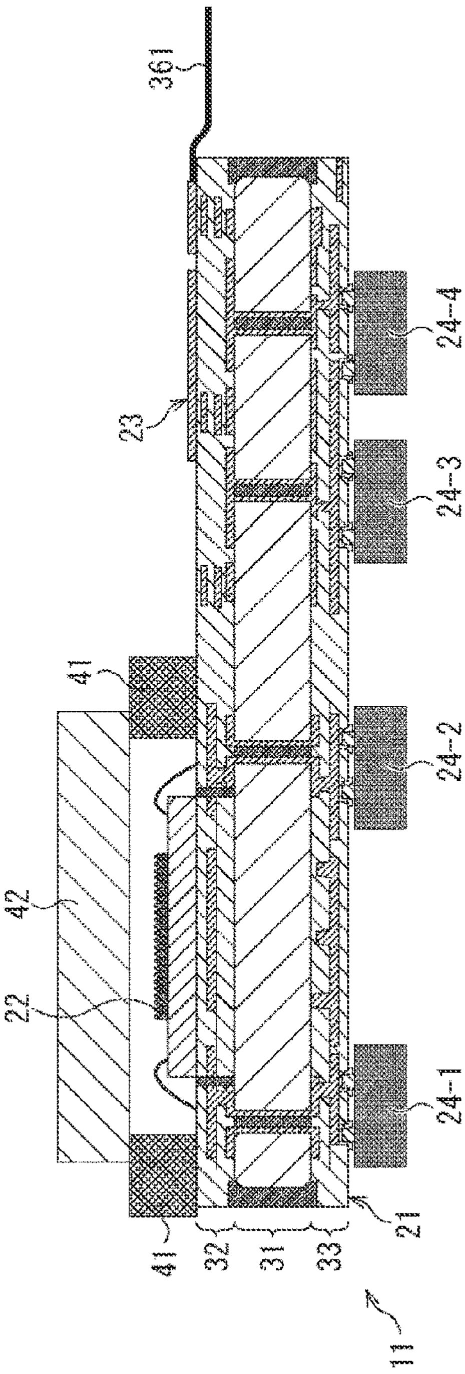
FIG. 11 is a diagram illustrating another configuration example of the sensor module.

In such a case, for example, the sensor module 11 is configured as illustrated in FIG. 11.

The configuration of the sensor module 11 illustrated in FIG. 11 is a configuration in which a heat dissipation member 361 is further provided in the configuration of the sensor module 11 in FIG. 1.

In this example, for example, a shared analog ground (not illustrated) is provided in the wiring layer 32 of the semiconductor substrate 21. And, the shared analog ground is used as both the analog ground for the image sensor 22 and the millimeter wave reflection analog ground of the millimeter wave radar.

Furthermore, for example, the heat dissipation member 361 including a graphite sheet or the like is connected to the shared analog ground, and the shared analog ground also functions as a heat spreader. As a result, heat can be dissipated more efficiently.

In this case, for example, heat generated by the image sensor 22 or the like is heat-transported to the heat dissipation member 361 via the shared analog ground and dissipated to the outside air.

Note that, since the antenna unit 23, which is an antenna of the millimeter wave radar, is a passive component, even if the millimeter wave reflection analog ground of the millimeter wave radar is used as a heat dissipation path (heat spreader), the operation and characteristics of the millimeter wave radar are not particularly affected.

Ninth Embodiment

<Configuration Example of Sensor Module>

Figure 12:
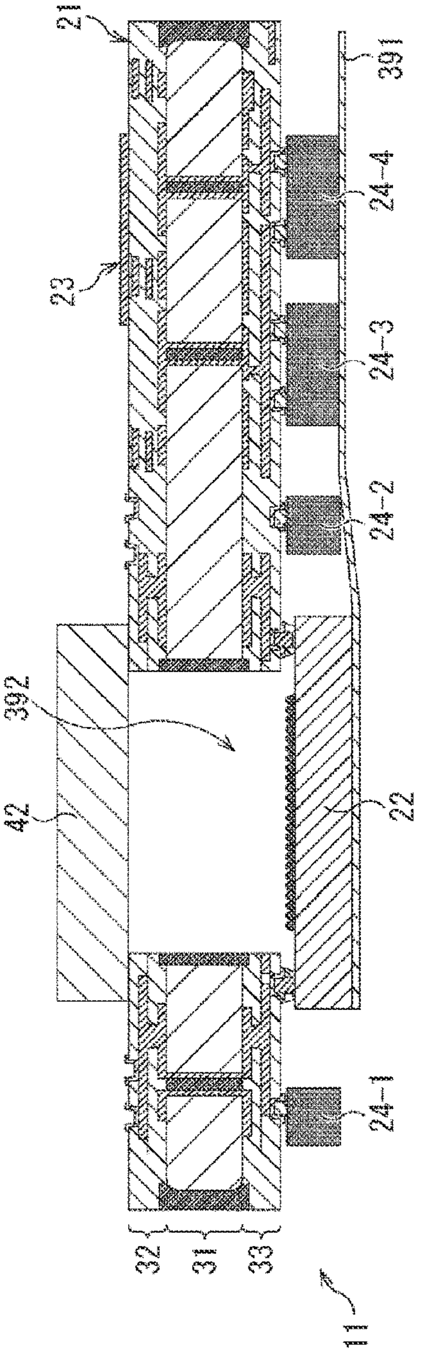
FIG. 12 is a diagram illustrating another configuration example of the sensor module.

Furthermore, for example, as illustrated in FIG. 12, in a case where the image sensor 22 is flip-chip mounted, a structure may be obtained in which heat-transport can be performed directly from the image sensor 22 and the elements 24 for the millimeter wave radar by a heat dissipation member 391.

In the example illustrated in FIG. 12, the image sensor 22 is flip-chip mounted on the surface of the semiconductor substrate 21 opposite to the surface on which the antenna unit 23 is provided.

That is, a through-hole 392 for flip-chip mounting is formed in the semiconductor substrate 21, and the image sensor 22 is flip-chip mounted on the portion of the through-hole 392 on the back surface of the semiconductor substrate 21. In particular, here, the light receiving surface of the image sensor 22 faces the light incident side surface of the semiconductor substrate 21.

Furthermore, the cover glass 42 is disposed on the light incident side surface of the semiconductor substrate 21, and the light incident side of the through-hole 392 is covered with the cover glass 42. Moreover, the antenna unit 23 of the millimeter wave radar is formed on the light incident side surface of the semiconductor substrate 21.

Therefore, the light receiving surface of the image sensor 22 is disposed in a space surrounded by the semiconductor substrate 21, more specifically, the side surfaces of the semiconductor substrate 21 forming the through-hole 392, the image sensor 22, and the cover glass 42. In other words, the light receiving surface of the image sensor 22 and the antenna unit 23 are disposed at spatially partitioned positions.

Furthermore, in this example, the elements 24-2 to 24-4 are IC elements (millimeter wave elements) such as amplifiers constituting the millimeter wave radar, and these elements 24-2 to 24-4 and the image sensor 22 are disposed on the same surface.

And, the heat dissipation member 391 including a graphite sheet or the like is connected to the surface of each of the elements 24-2 to 24-4 and the image sensor 22 opposite to the back surface side of the semiconductor substrate 21.

Therefore, since heat generated by the image sensor 22 and the elements 24 is directly heat-transported by the heat dissipation member 391 without passing through the analog ground or the like, heat can be dissipated more efficiently.

Moreover, in this example, since the image sensor 22 is mounted on the surface of the semiconductor substrate 21 opposite to the surface on which the antenna unit 23 is provided, it is possible to suppress the influence of a millimeter wave emitted from the antenna unit 23, which is received by the image sensor 22.

Note that, in the example illustrated in FIG. 12, the antenna unit 121 illustrated in FIG. 3 or FIG. 4 may be further provided immediately above the antenna unit 23 on the semiconductor substrate 21. Furthermore, in the example illustrated in FIG. 12, the antenna unit 81 illustrated in FIG. 2 may be provided instead of the antenna unit 23.

Tenth Embodiment

<Configuration Example of Antenna Unit>

Moreover, in the example illustrated in FIG. 1, the transmission antenna unit 51 and the reception antenna unit 52 are provided at positions adjacent to each other. However, for example, as illustrated in FIG. 13, the transmission antenna unit 51 and the reception antenna unit 52 may be arranged on both sides of the image sensor 22.

Figure 13:
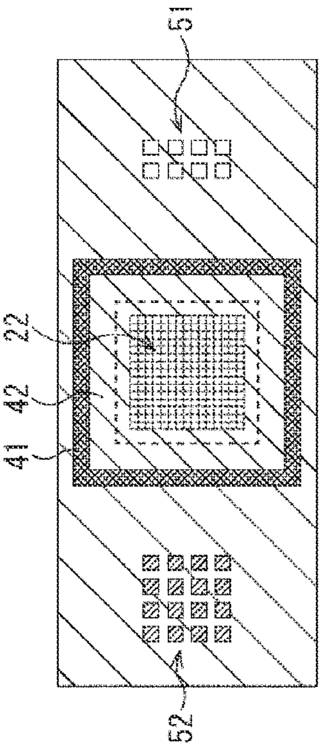
FIG. 13 is a diagram illustrating another example of the disposition of a transmission antenna unit and a reception antenna unit.

FIG. 13 is a diagram in which the sensor module 11 is viewed from the direction perpendicular to the surface of the semiconductor substrate 21.

In this example, the image sensor 22 is provided at the center of the light incident side surface of the semiconductor substrate 21, and the image sensor 22 is disposed in a space surrounded by the semiconductor substrate 21, the frame 41, and the cover glass 42.

Furthermore, the transmission antenna unit 51 is provided on the right side of the image sensor 22 in the drawing, and the reception antenna unit 52 is provided on the left side of the image sensor 22 in the drawing. In other words, the image sensor 22 is disposed between the transmission antenna unit 51 and the reception antenna unit 52.

As described above, by disposing the transmission antenna unit 51 and the reception antenna unit 52 at positions away from each other to some extent, oscillation and reception of a millimeter wave, in other words, the transmission circuit and the reception circuit can be clearly electrically divided (separated). As a result, further favorable characteristics can be obtained for the measurement by the millimeter wave radar.

<Functional Configuration Example of Sensor Module>

For example, the sensor module 11 having each configuration described above can be used for gesture assist.

In such a case, for example, the sensor module 11 has a configuration in which a high-speed low-pixel-number imaging device and a millimeter wave radar are mounted, the device being configured by the image sensor 22 and the like, and a PDIC pixel in which a photodiode (PD) and an IC are integrated being applied to the device.

For example, the high-speed low-pixel-number imaging device is used for detection of a relatively high-speed movement such as a blink of a target user, and the millimeter wave radar is used for detection of a relatively low-speed movement. In such a case, at the time of detection of a blink, for example, it is necessary to image an image (video) at a frame rate of about 20 kHz in the high-speed low-pixel-number imaging device.

Furthermore, the sensor module 11 described above can be applied to or mounted on various electronic devices such as mobile devices and building components for factories and homes, in addition to vehicles such as automobiles and moving bodies such as trains and ships.

Figure 14:
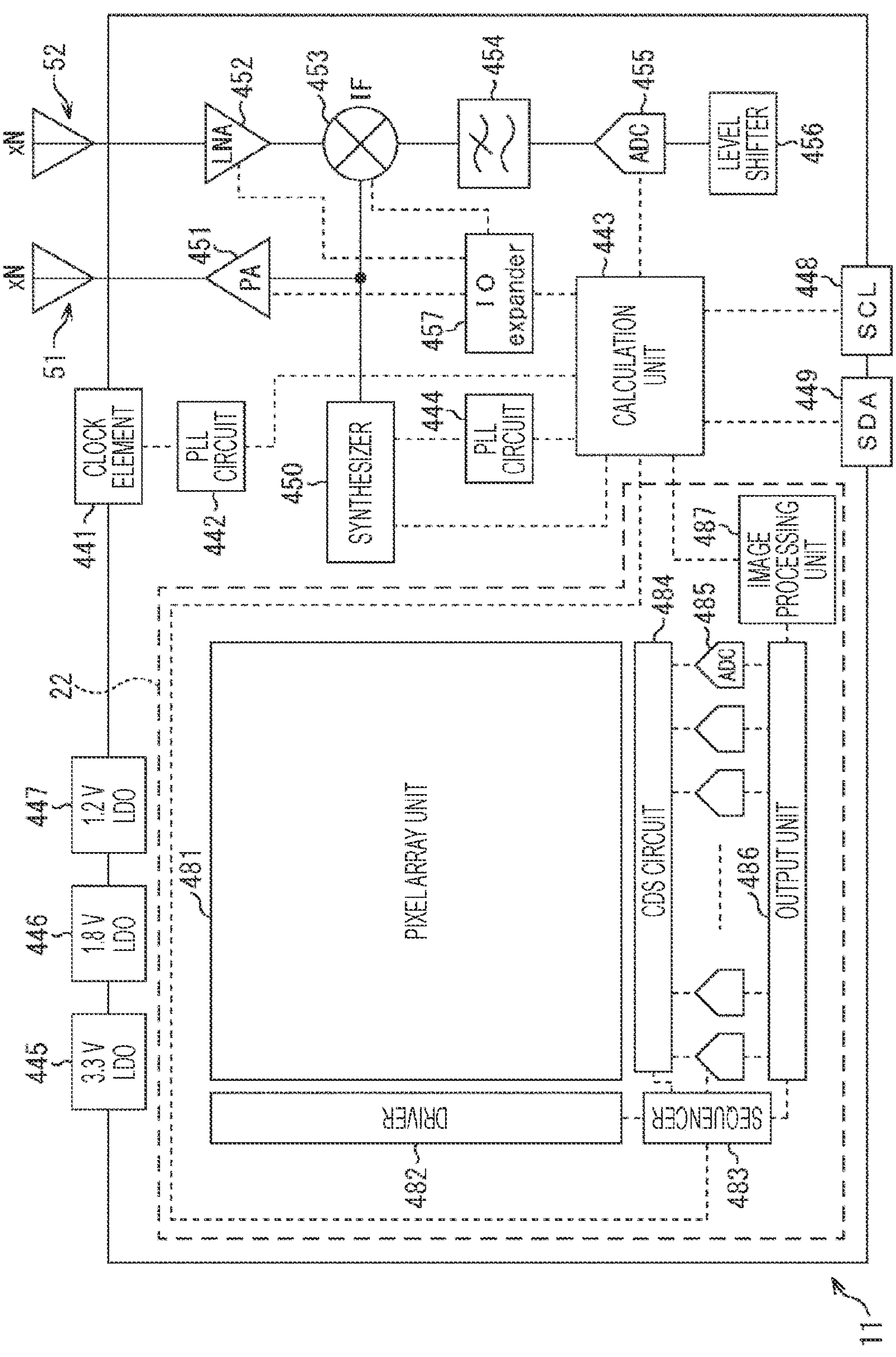
FIG. 14 is a diagram illustrating a functional configuration example of the sensor module.

Moreover, for example, the functional configuration of the sensor module 11 described above can be the configuration illustrated in FIG. 14. In particular, here, the functional configuration of the sensor module 11 illustrated in FIG. 1 will be described with reference to FIG. 14.

The sensor module 11 illustrated in FIG. 14 includes the image sensor 22, a clock element 441, a phase locked loop (PLL) circuit 442, a calculation unit 443, a 3.3 V LDO 445, a 1.8 V LDO 446, a 1.2 V LDO 447, a serial clock line (SCL) 448, a serial data line (SDA) 449, a synthesizer 450, an amplification unit 451, the transmission antenna unit 51, the reception antenna unit 52, an amplification unit 452, a mixer 453, a low pass filter (LPF) 454, an analog to digital converter (ADC) 455, a level shifter 456, and an TO expander 457.

For example, in the sensor module 11, a millimeter wave radar of a frequency modulated continuous wave (FMCW) method is realized by the synthesizer 450, the amplification unit 451, the transmission antenna unit 51, the reception antenna unit 52, the amplification unit 452, the mixer 453, the LPF 454, the ADC 455, the level shifter 456, and the like.

For example, the clock element 441 includes a crystal oscillator, and outputs a signal of a predetermined frequency for generating a clock signal to the PLL circuit 442. The PLL circuit 442 generates a clock signal by, for example, frequency-dividing the signal supplied from the clock element 441, and supplies the clock signal to the calculation unit 443.

For example, the calculation unit 443 includes a digital signal processor (DSP), a field programmable gate array (FPGA), a central processing unit (CPU), and the like, and controls the entire operation of the sensor module 11.

For example, the calculation unit 443 operates each unit of the sensor module 11 on the basis of the clock signal supplied from the PLL circuit 442, and supplies the clock signal supplied from the PLL circuit 442 to the image sensor 22 and the like.

Furthermore, for example, the calculation unit 443 supplies a control signal to the amplification unit 451, the amplification unit 452, and the mixer 453 via the TO expander 457 for expansion, thereby controlling the operation of the amplification unit 451, the amplification unit 452, and the mixer 453.

The image sensor 22 includes a pixel array unit 481, a driver 482, a sequencer 483, a correlated double sampling (CDS) circuit 484, an ADC 485, an output unit 486, and an image processing unit 487.

In the pixel array unit 481, a plurality of pixels is provided by being arranged in a matrix. Here, the lateral direction in the drawing is the row direction, and a plurality of pixels arranged in the row direction is also referred to as a pixel row. Furthermore, the vertical direction in the drawing is the column direction, and a plurality of pixels arranged in the column direction is also referred to as a pixel column.

For example, a pixel constituting the pixel array unit 481 includes a PD, a transfer transistor, floating diffusion (FD), an amplification transistor, a selection transistor, and a reset transistor.

In such a case, light incident on the photoelectric conversion unit (PD) is photoelectrically converted, and an electrical charge obtained as a result thereof is transferred to the FD via the transfer transistor.

Then, in a case where the selection transistor is turned on, the signal of a voltage corresponding to the electrical charges accumulated in the FD is output to a vertical signal line (not illustrated) via the amplification transistor and the selection transistor. Furthermore, the reset transistor is turned on and the electrical charges accumulated in the FD and the PD are discharged as appropriate.

In the pixel array unit 481 including the pixels having such a configuration, it is possible to image a high-quality image with less noise.

Note that the configuration of each pixel is not limited to the above-described configuration, and may be any configuration such as a configuration in which the transfer transistor or the selection transistor is omitted from the above-described configuration.

The driver 482 supplies a drive signal to each pixel constituting the pixel array unit 481 via a signal line (not illustrated), thereby controlling the operation of each pixel such as transfer of an electrical charge and reading of a signal.

The sequencer 483 controls the operation timing of the driver 482, the CDS circuit 484, the ADC 485, and the output unit 486 on the basis of the clock signal supplied from the calculation unit 443.

The CDS circuit 484 generates a pixel signal by performing correlated double sampling (CDS) on a signal supplied from each pixel of the pixel array unit 481 via a vertical signal line (not illustrated), and supplies the pixel signal to the ADC 485 corresponding to each pixel column.

In the image sensor 22, the ADC 485 is provided for each pixel column (vertical signal line). However, here, only some of the ADCs 485 are assigned a reference sign in order to make the drawing easy to see.

The ADC 485 converts the analog pixel signal supplied from the CDS circuit 484 into a digital pixel signal, and supplies the digital pixel signal to the output unit 486. The output unit 486 generates an image signal on the basis of the pixel signal of each pixel supplied from each ADC 485, and supplies the image signal to the image processing unit 487.

The image processing unit 487 performs various types of image processing such as color space conversion and demosaic processing on the image signal supplied from the output unit 486, and supplies an image signal obtained as a result thereof to the calculation unit 443. In the calculation unit 443, object recognition or the like is performed on the image signal supplied from the image processing unit 487, that is, the video imaged by the image sensor 22.

Furthermore, the sensor module 11 is provided with a 3.3 V LDO 445, a 1.8 V LDO 446, and a 1.2 V LDO 447 that function as an analog or digital power supply that supplies power to each unit of the sensor module 11. For example, the 3.3 V LDO 445 to the 1.2 V LDO 447 are shared by the image sensor 22 and the millimeter wave radar.

The SCL 448 and the SDA 449 are I2C buses that connect the calculation unit 443 and an external device. In particular, the SCL 448 is a signal line for clock and the SDA 449 is a signal line for data transfer. The calculation unit 443 exchanges data with an external device via the SDA 449.

The PLL circuit 444 generates a new clock signal by, for example, frequency-dividing the clock signal supplied from the calculation unit 443, and supplies the new clock signal to the synthesizer 450.

The synthesizer 450 generates an FMCW signal whose frequency changes with time by performing sweeping in the frequency direction on the basis of the clock signal supplied from the PLL circuit 444, and supplies the FMCW signal to the amplification unit 451 and the mixer 453.

The amplification unit 451 amplifies the FMCW signal supplied from the synthesizer 450 and supplies the amplified FMCW signal to the transmission antenna unit 51, thereby emitting (outputting) a millimeter wave corresponding to the FMCW signal from the transmission antenna unit 51.

The amplification unit 452 amplifies the reception signal corresponding to the millimeter wave received by the reception antenna unit 52 and supplies the amplified reception signal to the mixer 453. The mixer 453 generates an intermediate frequency signal by mixing the FMCW signal supplied from the synthesizer 450 and the reception signal supplied from the amplification unit 452, and supplies the intermediate frequency signal to the LPF 454.

The LPF 454 performs filtering of causing only a low-frequency component to pass through, on the intermediate frequency signal supplied from the mixer 453, and supplies an output signal obtained as a result thereof to the ADC 455.

The level shifter 456 supplies a reference signal whose voltage changes with time to the ADC 455. The ADC 455 performs AD conversion on the output signal supplied from the LPF 454 on the basis of the reference signal supplied from the level shifter 456, and supplies a digital output signal obtained as a result thereof to the calculation unit 443.

In the calculation unit 443, the distance to an object in front of the sensor module 11, that is, the position of the object and the moving speed of the object are obtained on the basis of the output signal supplied from the ADC 455.

For example, in a case where an object to be measured is moving, if a millimeter wave is reflected by the object, the phase of the millimeter wave is shifted. Therefore, in the sensor module 11, the distance to an object and the speed of the object are measured from a phase shift (phase difference) between an FMCW signal and a reception signal, that is, an intermediate frequency signal corresponding to the phase shift.

In the sensor module 11 having the above configuration, a clock signal generated from the output of the same (one) clock element 441 is used in the imaging operation by the image sensor 22 and the operation at the time of measurement by the millimeter wave radar such as the generation of an FMCW signal. Furthermore, the image sensor 22 and the transmission antenna unit 51 and the reception antenna unit 52 constituting the antenna unit 23 are disposed at close distances.

Therefore, a time lag, that is, temporal deviation hardly occurs between the imaging timing of an image (video) in the image sensor 22 (frame rate of images) and the emission timing of a millimeter wave in the antenna unit 23.

Furthermore, calibration for synchronizing an image signal and an output signal in the calculation unit 443 is generally required at regular time intervals. However, in the sensor module 11, since the deviation between the imaging timing and the emission timing does not substantially occur as described above, calibration for synchronizing an image signal and an output signal is not required or can be performed instantaneously.

Moreover, in the sensor module 11, the image sensor 22 and the antenna unit 23 are provided on the same semiconductor substrate 21. Therefore, the relative positional relationship between the image sensor 22 and the antenna unit 23 is always constant, and calibration of the positional relationship is not required or can be easily performed.

<Description of Manufacturing Process>

Next, a method for manufacturing the sensor module 11 described above will be described. Note that, here, manufacturing of each sensor module 11 illustrated in FIGS. 2 and 3 will be described as an example. However, basically, the sensor module 11 having a different configuration can also be manufactured similarly to the sensor modules 11 illustrated in FIGS. 2 and 3.

Figure 15:
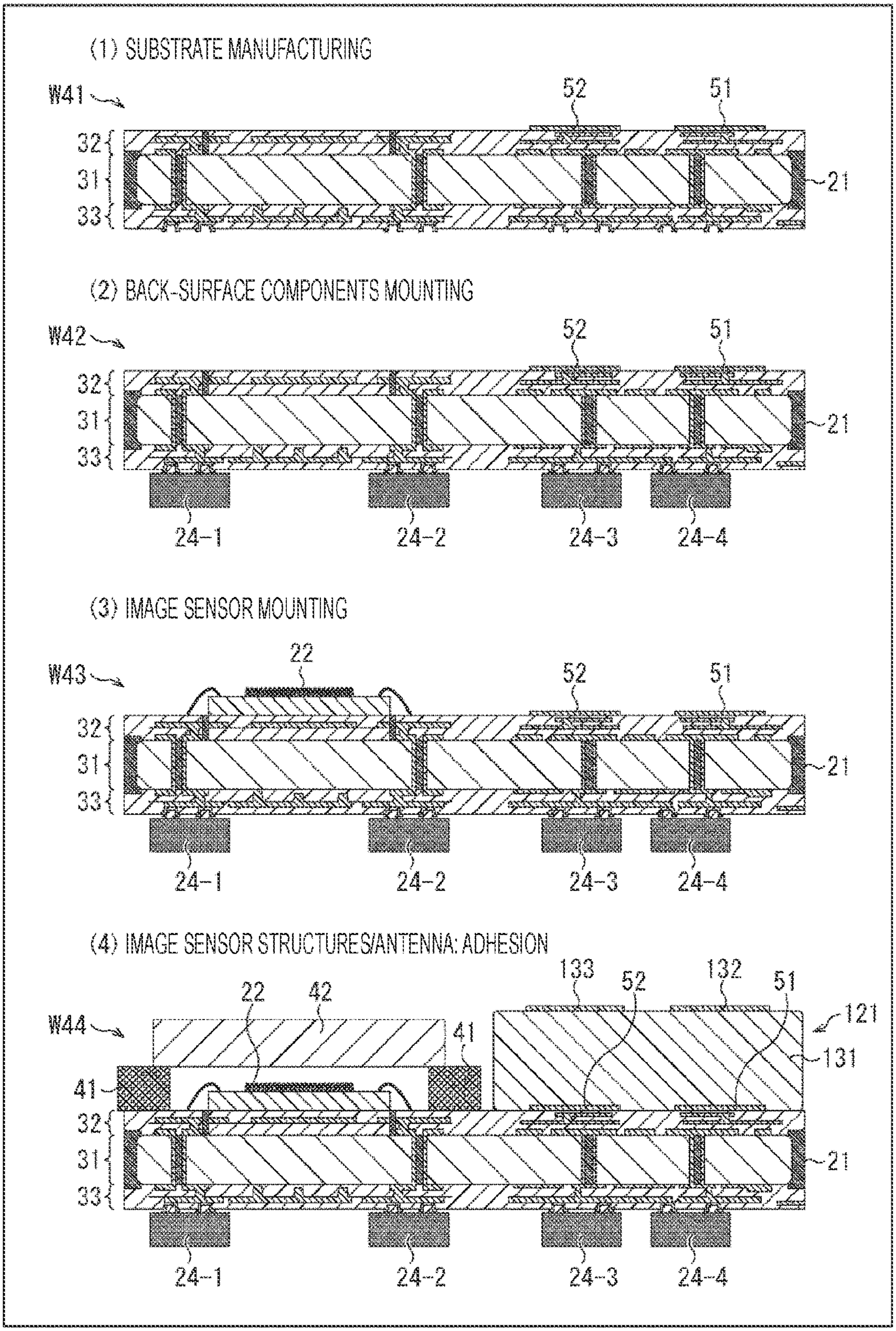
FIG. 15 is a diagram for describing a manufacturing process.

First, a manufacturing process of manufacturing the sensor module 11 having the configuration illustrated in FIG. 3 will be described with reference to FIG. 15.

First, as indicated by an arrow W41, the semiconductor substrate 21 including the core substrate 31, the wiring layer 32, and the wiring layer 33 is manufactured. In this step, the transmission antenna unit 51 and the reception antenna unit 52 are also formed on the surface of the wiring layer 32.

Subsequently, as indicated by an arrow W42, components such as the elements 24 are mounted on the back surface of the semiconductor substrate 21, that is, the surface of the wiring layer 33, and further, as indicated by an arrow W43, the image sensor 22 is mounted on the light incident side surface of the semiconductor substrate 21, that is, the surface of the wiring layer 32.

Finally, as indicated by an arrow W44, the structures related to the image sensor 22 and the antenna unit 121 are formed on the light incident side surface of the semiconductor substrate 21, that is, the surface of the wiring layer 32.

For example, in this example, the frame 41 surrounding the periphery of the image sensor 22 is fixed by adhesion or the like on the light incident side surface of the semiconductor substrate 21, and the cover glass 42 is further fixed by adhesion or the like on the upper portion of the frame 41.

Furthermore, the antenna unit 121 is mounted by adhesion or the like at a position immediately above the transmission antenna unit 51 and the reception antenna unit 52 on the light incident side surface of the semiconductor substrate 21.

After each of the above steps is performed, the sensor module 11 illustrated in FIG. 3 is completed.

Figure 16:
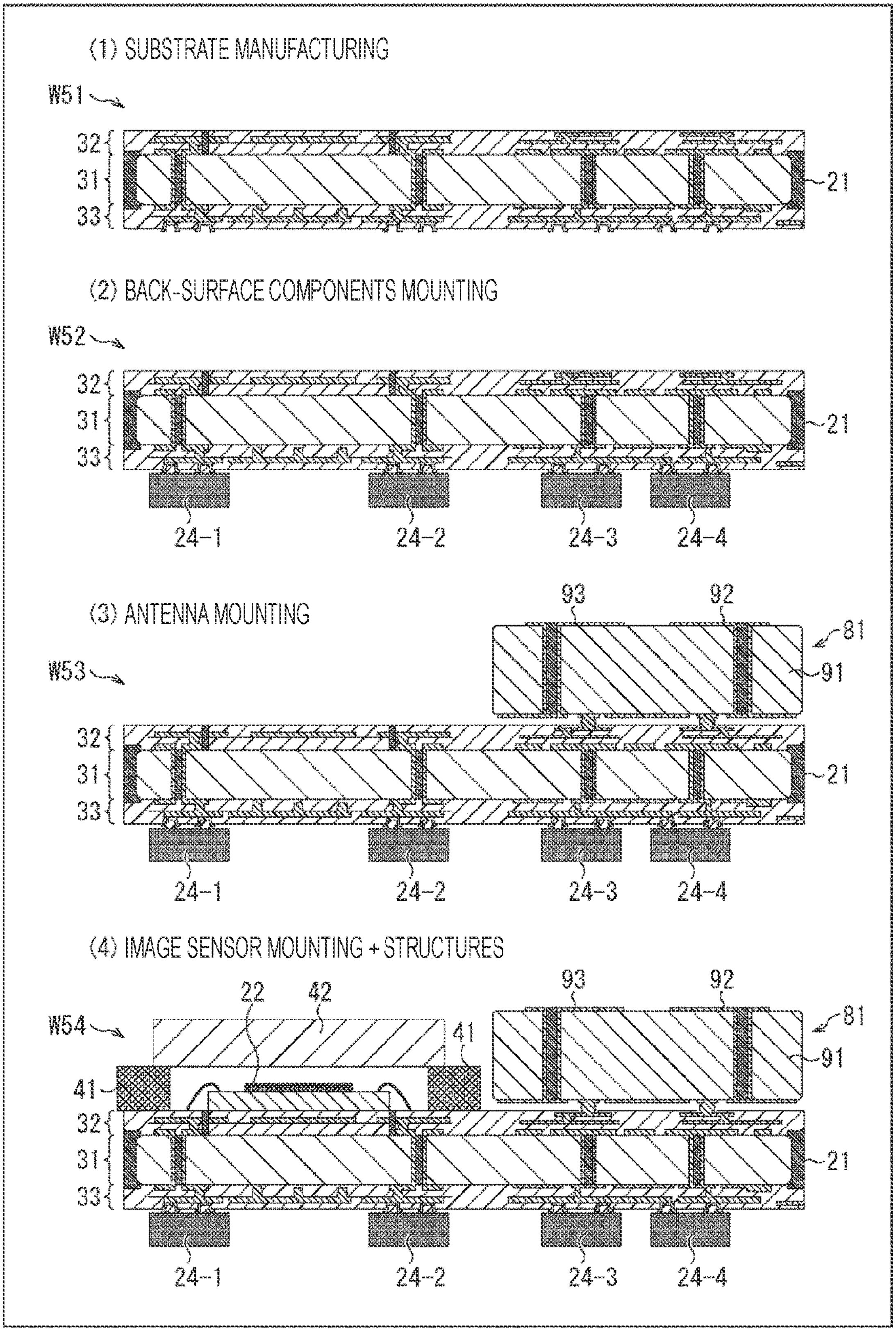
FIG. 16 is a diagram for describing a manufacturing process.

Next, a manufacturing process of manufacturing the sensor module 11 having the configuration illustrated in FIG. 2 will be described with reference to FIG. 16.

First, as indicated by an arrow W51, the semiconductor substrate 21 including the core substrate 31, the wiring layer 32, and the wiring layer 33 is manufactured.

Subsequently, as indicated by an arrow W52, components such as the elements 24 are mounted on the back surface of the semiconductor substrate 21, that is, the surface of the wiring layer 33.

Moreover, as indicated by an arrow W53, the antenna unit 81 is mounted on the light incident side surface of the semiconductor substrate 21, that is, the surface of the wiring layer 32.

Finally, as indicated by an arrow W54, the image sensor 22 and the structures related to the image sensor 22 are formed on the light incident side surface of the semiconductor substrate 21, that is, the surface of the wiring layer 32.

For example, in this example, the image sensor 22 is mounted on the light incident side surface of the semiconductor substrate 21. Then, thereafter, the frame 41 surrounding the periphery of the image sensor 22 is fixed by adhesion or the like on the light incident side surface of the semiconductor substrate 21, and the cover glass 42 is further fixed by adhesion or the like on the upper portion of the frame 41.

After each of the above steps is performed, the sensor module 11 illustrated in FIG. 2 is completed.

Eleventh Embodiment

<Configuration Example of Sensor Module>

For example, in the sensor module 11 illustrated in FIG. 2, by providing the emission surface (antenna surface) of the antenna unit 81 in front of the structures related to the image sensor 22, the occurrence of interference of a millimeter wave for measurement caused by the structures related to the image sensor 22 is suppressed.

In the example of FIG. 2, the frame 41 and the cover glass 42 are provided as the structures related to the image sensor 22. However, a lens housing or the like may be further provided as a structure related to the image sensor 22. In a case where a lens housing or the like is provided, it is necessary to position the emission surface of a millimeter wave further in front in order to suppress the occurrence of interference of a millimeter wave.

Therefore, a bottom-raising substrate (free-scale board), with which unnecessary emission is less likely to be generated, may be provided between the package of millimeter wave radar (antenna-on package) and the semiconductor substrate 21. As a result, the package of millimeter wave radar and the image sensor 22 can be disposed closer to each other while suppressing the occurrence of interference of a millimeter wave.

Figure 17:
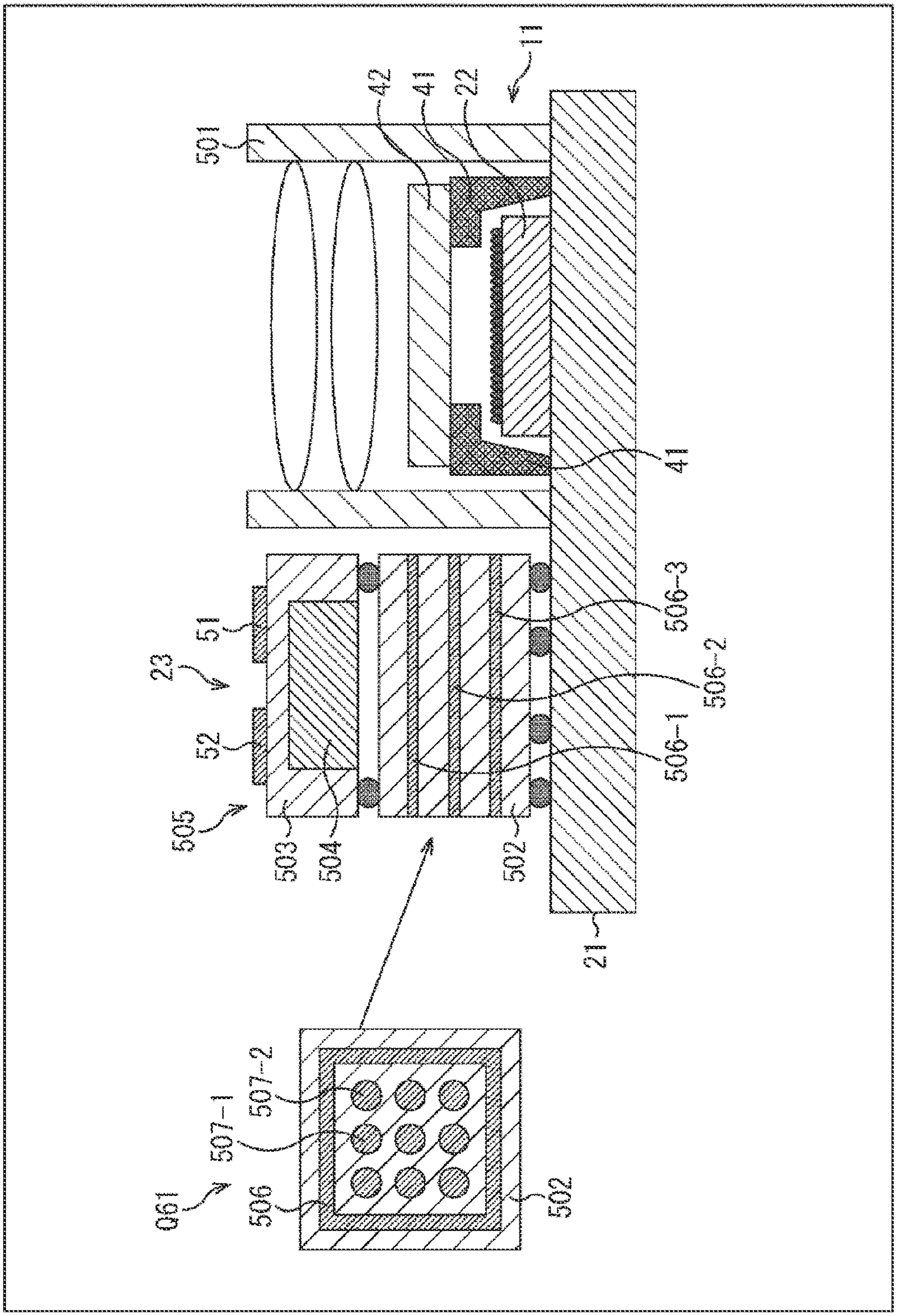
FIG. 17 is a diagram illustrating another configuration example of the sensor module.

In such a case, for example, the sensor module 11 is configured as illustrated in FIG. 17. FIG. 17 illustrates a cross section of the sensor module 11. Note that, in FIG. 17, same reference sign is assigned to a portion corresponding to that in the case of FIG. 1, and description thereof will be omitted as appropriate.

In the sensor module 11 illustrated in FIG. 17, the image sensor 22 is mounted on the semiconductor substrate 21, and the frame 41 and the cover glass 42 are provided in the disposition similar to that in the example of FIG. 1 so as to surround the image sensor 22.

Furthermore, a lens housing 501 including lenses that guide light from the outside to the image sensor 22 is provided on the semiconductor substrate 21, and the image sensor 22, the frame 41, and the cover glass 42 are covered with the lens housing 501.

In this example, the frame 41, the cover glass 42, and the lens housing 501 are provided as the structures related to the image sensor 22.

A bottom-raising substrate 502 is mounted by bumps at a position adjacent to the lens housing 501 over the semiconductor substrate 21, and a substrate 503 constituting the package of millimeter wave radar, that is, a module of millimeter wave radar is mounted by bumps over the bottom-raising substrate 502.

An RFIC 504 that generates an analog signal is disposed in the substrate 503. For example, the RFIC 504 corresponds to the synthesizer 450, the mixer 453, and the like illustrated in FIG. 14. In other words, the RFIC 504 is provided with the synthesizer 450, the mixer 453, and the like.

Furthermore, the antenna unit 23 including a plurality of patch antennas formed by patterning is provided on the surface of the substrate 503 opposite to the bottom-raising substrate 502. The antenna unit 23 includes the transmission antenna unit 51 and the reception antenna unit 52, and functions as the antenna of the millimeter wave radar (millimeter wave antenna).

In the example of FIG. 17, the substrate 503, the RFIC 504, and the antenna unit 23 constitute a millimeter wave module 505, which is the module (package) of millimeter wave radar. In particular, in this example, the analog unit is integrated in the millimeter wave module 505 of the millimeter wave radar.

In the sensor module 11, the bottom-raising substrate 502 having a thickness (height) according to the height of the lens housing 501 is provided between the millimeter wave module 505 and the semiconductor substrate 21. In other words, the millimeter wave module 505 is mounted over the semiconductor substrate 21 via the bottom-raising substrate 502.

Therefore, the sensor module has a configuration in which the antenna unit 23 of the millimeter wave radar (antenna surface of a millimeter wave) is located before (in front of) the structures related to the image sensor 22 such as the lens housing 501 in the emission direction of a millimeter wave, that is, the longitudinal direction in the drawing.

As a result, it is possible to suppress the occurrence of interference (reduce interference) due to reflection of a millimeter wave (radio wave) for measurement by the structures related to the image sensor 22 such as the lens housing 501, and to further improve characteristics related to measurement such as position and speed. Furthermore, since the occurrence of interference can be suppressed, the millimeter wave module 505 and the image sensor 22 can be disposed close to each other, and the sensor module 11 can be downsized.

In particular, in the sensor module 11, since it is only required to adjust the thickness (height) of the bottom-raising substrate 502 according to the height of the lens housing 501 or the like, interference of a millimeter wave can be easily suppressed.

Note that the disposed position of the antenna unit 23 (antenna surface of a millimeter wave) is not necessarily required to be in front of the structures related to the image sensor 22 in the millimeter wave emission direction. The antenna unit may be disposed at any position as long as interference of a millimeter wave can be sufficiently suppressed.

A plurality of through holes (through vias) electrically connecting the millimeter wave module 505 (substrate 503) and the semiconductor substrate 21 is formed in the bottom-raising substrate 502.

The application of these through holes is only transmission of analog I/O signals or power supply for the millimeter wave module 505. That is, only a through hole for transmission of an input signal supplied (input) to the millimeter wave module 505, a through hole for transmission of an output signal output from the millimeter wave module 505, and a through hole for supplying power to the millimeter wave module 505 are provided as the through holes in the bottom-raising substrate 502.

Between the millimeter wave module 505 and the semiconductor substrate 21, only exchanging of I/O signals (input signal and output signal) and power supply is performed via the bottom-raising substrate 502.

As described above, since the bottom-raising substrate 502 is a circuit substrate that transmits (passes) only I/O signals and power supply, there is almost no unnecessary emission from the bottom-raising substrate 502. Therefore, it is possible to suppress the occurrence of interference on the image sensor 22 caused by an unnecessary millimeter wave emitted from the bottom-raising substrate 502, and the millimeter wave module 505 and the image sensor 22 can be disposed closer to each other.

In addition to the through holes, three ground layers 506-1 to 506-3 are also formed in the bottom-raising substrate 502. For example, these ground layers 506-1 to 506-3 are electrically connected to the ground or the like provided in the semiconductor substrate 21.

Note that, hereinafter, in a case where it is not necessary to particularly distinguish the ground layers 506-1 to 506-3 from each other, the ground layers are also simply referred to as ground layers 506. Furthermore, here, an example in which three ground layers 506 arranged in a direction perpendicular to the surface of the bottom-raising substrate 502 are formed in the bottom-raising substrate 502 will be described. However, the number of ground layers 506 to be formed may be any number.

The portion indicated by an arrow Q61 in FIG. 17 illustrates a drawing of the ground layer 506 portion in the bottom-raising substrate 502 as viewed from the direction perpendicular to the surface of the bottom-raising substrate 502.

In this example, a plurality of through holes including a through hole 507-1 and a through hole 507-2 is formed in the bottom-raising substrate 502, and the ground layers 506 including a ground wiring pattern having a rectangular frame shape are formed so as to surround all the through holes.

For example, the through hole 507-1 and the through hole 507-2 are the above-described through holes for transmission of I/O signals or power supply. Hereinafter, in a case where it is not necessary to particularly distinguish the through holes provided in the bottom-raising substrate 502, such as the through hole 507-1 and the through-holes 507-2, from each other, the through holes are also simply referred to as through holes 507.

For example, when an input signal is supplied from the semiconductor substrate 21 via the through holes 507, the millimeter wave module 505 emits a millimeter wave from the transmission antenna unit 51 according to the input signal. Furthermore, for example, the millimeter wave module 505 supplies an output signal corresponding to a millimeter wave received by the reception antenna unit 52 to the semiconductor substrate 21 via the through holes 507.

By surrounding such through holes 507 for transmission of I/O signals or power supply, that is, the inside of the bottom-raising substrate 502 with the ground layers 506, noise from the outside can be reduced, and the quality of I/O signals can be improved.

<Modification 1 of Eleventh Embodiment>

<Configuration Example of Sensor Module>

In FIG. 17, an example in which the ground layers 506 having a rectangular frame shape are formed in the bottom-raising substrate 502 has been described. However, without being limited to this example, the ground layers may have any shape, or a configuration may be employed in which no ground layers are formed in the bottom-raising substrate 502.

Figure 18:
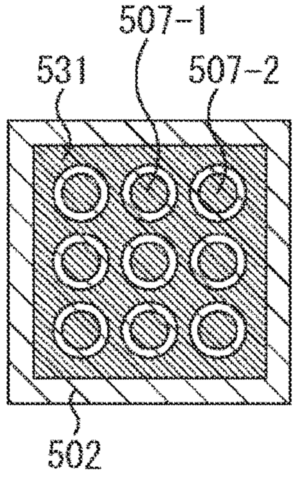
FIG. 18 is a diagram illustrating another configuration example of a bottom-raising substrate.

For example, as illustrated in FIG. 18, instead of the ground layers 506, a wiring pattern having a large area may be formed as a ground layer 531 on the bottom-raising substrate 502. Note that, in FIG. 18, same reference sign is assigned to a portion corresponding to that in the case of FIG. 17, and description thereof will be omitted as appropriate.

FIG. 18 illustrates a drawing of the ground layer 531 portion in the bottom-raising substrate 502 as viewed from the direction perpendicular to the surface of the bottom-raising substrate 502.

In this example, the region of the inner portion of the bottom-raising substrate 502 including the portion where the through holes 507 are formed is surrounded by the ground layer 531. The ground layer 531 includes a planar ground wiring pattern, and a capacitance is formed by the ground layer 531.

In particular, in this example, substantially all portions other than the through holes 507 in the inner portion of the bottom-raising substrate 502 are the wiring pattern constituting the ground layer 531, and as a result, the area of the ground layer 531 portion is wider (larger) than the area in the example of FIG. 17.

Since a larger capacitance is formed by such planar ground layer 531, the power supplied from the semiconductor substrate 21 to the millimeter wave module 505 can be further stabilized. Note that a wiring pattern that forms a capacitance for stabilizing power supply does not have to be the ground layer 531 as long as the wiring pattern is formed in the bottom-raising substrate 502.

<Modification 2 of Eleventh Embodiment>

<Configuration Example of Sensor Module>

Furthermore, it is also conceivable that the image sensor 22 is used as a distance measuring sensor in the sensor module 11.

Specifically, for example, by using the image sensor 22 in combination with a light source such as a laser diode (LD) or a light emitting diode (LED), distance measurement by an indirect time of flight (iToF) method can be achieved.

Figure 19:
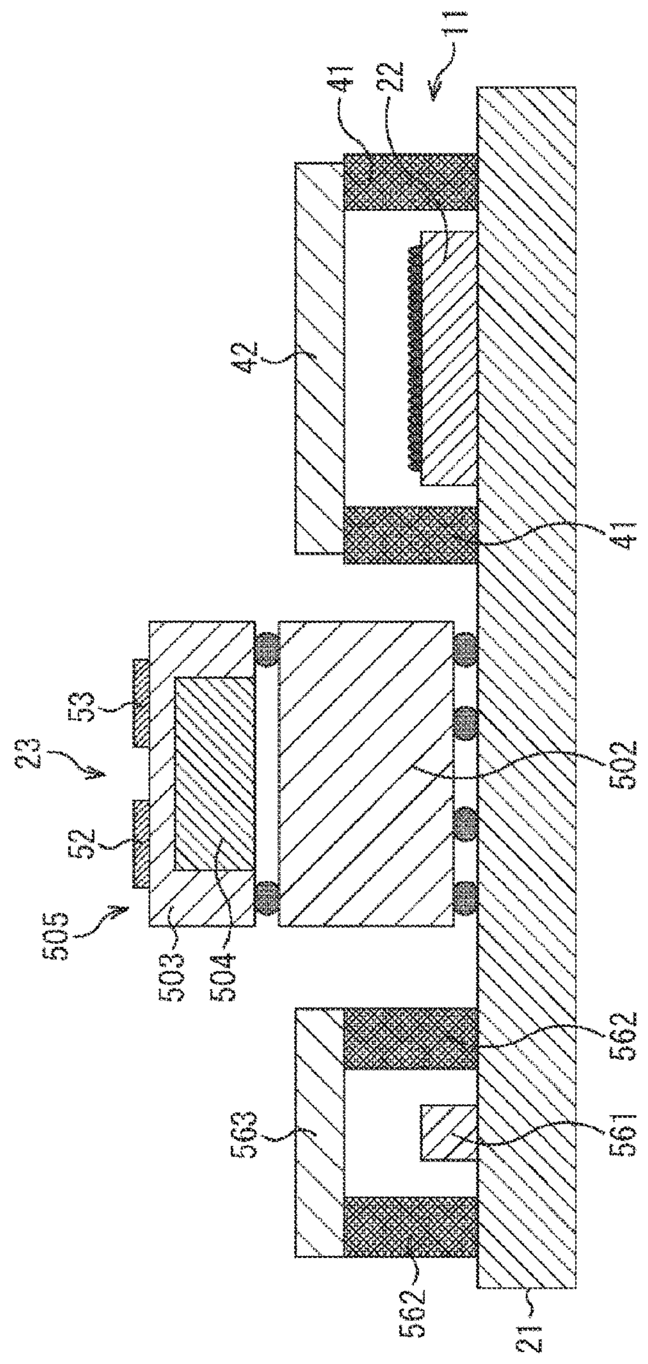
FIG. 19 is a diagram illustrating another configuration example of the sensor module.

In such a case, for example, the sensor module 11 has a configuration illustrated in FIG. 19. Note that, in FIG. 19, same reference sign is assigned to a portion corresponding to that in the case of FIG. 17, and description thereof will be omitted as appropriate.

In the sensor module 11 illustrated in FIG. 19, the image sensor 22 is mounted on the semiconductor substrate 21, and the frame 41 and the cover glass 42 are provided in the disposition similar to that in the example of FIG. 17 so as to surround the image sensor 22.

Furthermore, the bottom-raising substrate 502 is disposed at a position near the image sensor 22 over the semiconductor substrate 21, and the substrate 503 provided with the RFIC 504 and the antenna unit 23 is mounted (disposed) over the bottom-raising substrate 502.

Moreover, a light source 561 including an LD, an LED, or the like is mounted near the bottom-raising substrate 502 on the semiconductor substrate 21. In particular, over the semiconductor substrate 21, the millimeter wave module 505 (substrate 503), that is, the bottom-raising substrate 502 is disposed between the light source 561 and the image sensor 22.

A frame 562 is provided on the semiconductor substrate 21 so as to surround the periphery of the light source 561, and a plate-like cover glass 563 is provided on the upper portion of the frame 562 so as to face the light source 561. The cover glass 563 functions as a protective cover (protective member) for the protection, dust-proofing, and drip-proofing of the light source 561.

At the time of distance measurement by the iToF method, a subject in front is irradiated with distance measuring light from the light source 561, reflected light of the distance measuring light is received by the image sensor 22, and as a result, the distance to the subject is calculated on the basis of the signal obtained by the image sensor 22.

In this case, if the light source 561 is disposed adjacent to the image sensor 22, there is a possibility that the light output from the light source 561 directly enters the image sensor 22 and affects the distance measurement.

Therefore, in the sensor module 11 illustrated in FIG. 19, the millimeter wave module 505 and the bottom-raising substrate 502 are disposed between the light source 561 and the image sensor 22, and separation of light used for distance measurement by the iToF method is achieved. That is, of the light output from the light source 561, the light directly heading to the image sensor 22 is shielded by the millimeter wave module 505 and the bottom-raising substrate 502. Therefore, it is possible to suppress that the light output from the light source 561 directly enters the image sensor 22.

Moreover, in this case, since it is possible to suppress that the light from the light source 561 directly enters the image sensor 22, the light source 561, the millimeter wave module 505, and the image sensor 22 can be disposed close to each other.

Therefore, downsizing of the sensor module 11 can be achieved, and implementation of many functions such as the distance measuring function by a millimeter wave and the distance measuring function by the iToF method in the sensor module 11, that is, multi-functionalization can be achieved.

Twelfth Embodiment

<Configuration Example of Sensor Module>

Incidentally, the dielectric constant of the semiconductor substrate 21 constituting the sensor module 11 is larger than the dielectric constant of air, and electromagnetic waves easily propagate in a dielectric.

For example, in the example illustrated in FIG. 1, the image sensor 22 is directly mounted on the semiconductor substrate 21, and air exists around the semiconductor substrate 21.

Therefore, an electromagnetic wave (millimeter wave) generated in the antenna unit 23, that is, unnecessary radiation or the like passes through the inside of the semiconductor substrate 21 and is directly incident on a silicon (Si) portion of the image sensor 22, which may affect the characteristics related to imaging by the image sensor 22. In particular, it has been confirmed by actual measurement that an electromagnetic wave propagates in a semiconductor substrate in a high frequency band of around 80 Hz such as an in-vehicle radar.

Furthermore, in a case where the image sensor 22 and the frame 41 are mounted on the semiconductor substrate 21 by adhesion, there is a possibility that sufficient adhesion strength cannot be obtained, or the characteristics of the millimeter wave radar mounted on the same semiconductor substrate 21 are affected.

For example, material dedicated to high frequency such as fluorine-containing material, liquid crystal-based material, or non-polar resin material may be used for the pattern portion of the patch antennas constituting the antenna unit 23. However, if the wiring layer 32, the wiring layer 33, and the like of the semiconductor substrate 21 are formed in accordance with the structure formation of the image sensor 22, the high-frequency characteristics of the millimeter wave radar, such as, for example, energy loss and emission characteristics, are largely affected. That is, if the semiconductor substrate 21 on which the image sensor 22 and the like are easily mounted is used, there is a possibility that the high-frequency characteristics of the millimeter wave radar is deteriorated. In particular, in a high frequency band of around 80 Hz such as an in-vehicle radar, energy loss of a millimeter wave is largely affected.

On the other hand, if the configuration of the semiconductor substrate 21 is a substrate configuration dedicated to mounting of the millimeter wave radar, that is, formation of patch antennas without considering the ease of mounting of the image sensor 22 and the like, there is a possibility that the characteristics related to the image sensor 22, such as optical characteristics, are affected.

Specifically, for example, if the configuration of the semiconductor substrate 21 is a substrate configuration dedicated to formation of patch antennas, there is a possibility that warpage or deflection occurs in the mounting portion of the image sensor 22 in the semiconductor substrate 21 depending on a use environment or the like.

Figure 20:
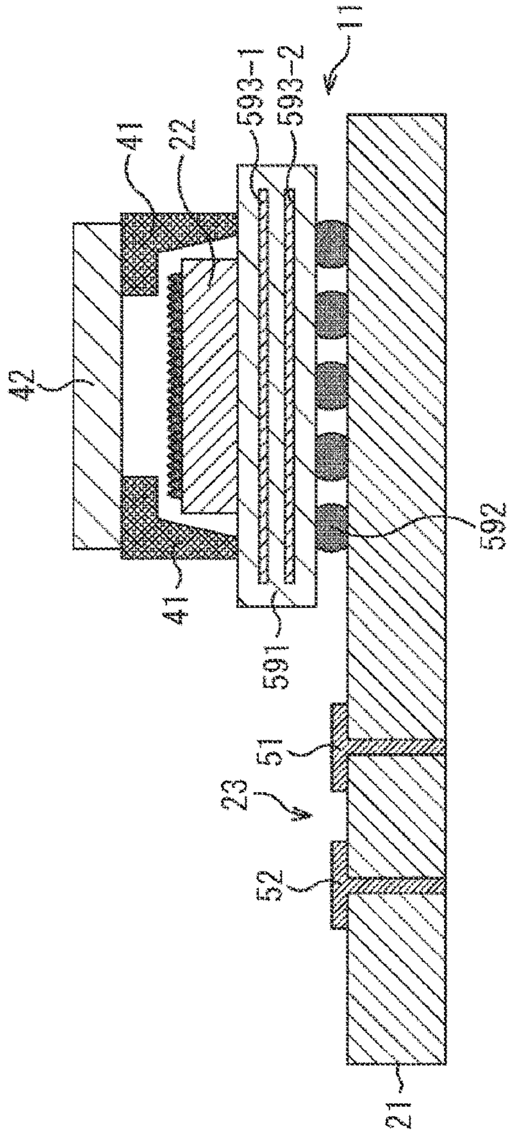
FIG. 20 is a diagram illustrating another configuration example of the sensor module.

Therefore, for example, as illustrated in FIG. 20, an interposer 591, which is a substrate having a substrate configuration dedicated to mounting of the image sensor 22, may be mounted by bumps over the semiconductor substrate 21 having a substrate configuration dedicated to formation of the antenna unit 23. Note that, in FIG. 20, same reference sign is assigned to a portion corresponding to that in the case of FIG. 1, and description thereof will be omitted as appropriate.

In the sensor module 11 illustrated in FIG. 20, the antenna unit 23 is formed on the semiconductor substrate 21. Note that the portion of the antenna unit 23 may be covered with a hollow cover or the like called a radome or the like.

The interposer 591 is mounted by a plurality of bumps (solder) including a bump 592 in a portion near the antenna unit 23 over the semiconductor substrate 21. By performing mounting by bumps, the interposer 591 can be mounted over the semiconductor substrate 21 with higher strength (adhesive strength) than mounting by adhesion.

The image sensor 22 is mounted on the surface of the interposer 591 opposite to the semiconductor substrate 21 side. That is, the image sensor 22 and the semiconductor substrate 21 are electrically connected by the interposer 591 disposed between the image sensor 22 and the semiconductor substrate 21.

Furthermore, on the surface of the interposer 591, the frame 41 and the cover glass 42 are provided in the disposition similar to that in the example of FIG. 1 so as to surround the image sensor 22.

A ground layer 593-1 and a ground layer 593-2 having a planar shape are formed inside the interposer 591.

Note that, hereinafter, in a case where it is not necessary to particularly distinguish the ground layer 593-1 and the ground layer 593-2 from each other, the ground layers are also simply referred to as ground layers 593. Furthermore, the number of ground layers 593 provided in the interposer 591 may be one, or three or more. Moreover, the ground layers 593 do not have to be provided in the interposer 591.

In the example of FIG. 20, the substrate configuration of the semiconductor substrate 21 is a substrate configuration dedicated to formation of the antenna unit 23. That is, for example, the semiconductor substrate 21 includes material suitable for formation of the antenna unit 23.

Furthermore, the substrate configuration of the interposer 591 is a substrate configuration dedicated to mounting of the image sensor 22. That is, for example, the interposer 591 includes material having a linear coefficient of thermal expansion (CTE) that provides sufficient adhesive strength when the image sensor 22 is mounted by adhesion, and hardly affects the characteristics related to the image sensor 22 when warpage or the like occurs in the image sensor 22.

Therefore, for example, the semiconductor substrate 21 and the interposer 591 have different linear coefficients of thermal expansion. In such a case, the warpage occurring in the image sensor 22 can be adjusted (alleviated) by the interposer 591 regardless of the physical properties of the semiconductor substrate 21.

As described above, by mounting the interposer 591 on which the image sensor 22 is directly mounted over the semiconductor substrate 21 on which the antenna unit 23 is formed, the substrate configuration of the semiconductor substrate 21 and the substrate configuration of the interposer 591 can be made different from each other. As a result, deterioration of the high-frequency characteristics of the millimeter wave radar can be suppressed, and at the same time, deterioration of the characteristics related to the image sensor 22 can be suppressed.

Furthermore, in the example of FIG. 20, the interposer 591 is mounted over the semiconductor substrate 21 by bumps. That is, a gap (air layer) is provided between the interposer 591 and the semiconductor substrate 21.

Therefore, it is possible to suppress that an electromagnetic wave (millimeter wave) generated in the antenna unit 23 propagates to the interposer 591, that is, the image sensor 22 through the inside of the semiconductor substrate 21. That is, it is possible to suppress interference of an electromagnetic wave generated in the antenna unit 23 with the image sensor 22, thereby suppressing deterioration of the characteristics related to the image sensor 22. Specifically, for example, power supply fluctuation or the like in the image sensor 22 can be suppressed, and the image sensor 22 can be driven more stably.

Moreover, since the ground layers 593 are formed in the interposer 591, propagation of an electromagnetic wave (millimeter wave) generated in the antenna unit 23 to the image sensor 22 can be further suppressed.

Note that, in consideration of the suppression of interference of an electromagnetic wave with the image sensor 22, the interposer 591 is desirably a substrate including material having a low dielectric constant, for example, an organic substrate. For example, the dielectric constant of the interposer 591 is set to be lower than the dielectric constant of the semiconductor substrate 21.

<Modification 1 of Twelfth Embodiment>
<Configuration Example of Sensor Module>

In order to further suppress propagation of unnecessary radiation (electromagnetic wave) or the like generated in the antenna unit 23 to the image sensor 22, among bumps for mounting the interposer 591, bumps connected to the ground may be arranged at intervals of ½ wavelength of the emission frequency of the antenna unit 23.

Figure 21:
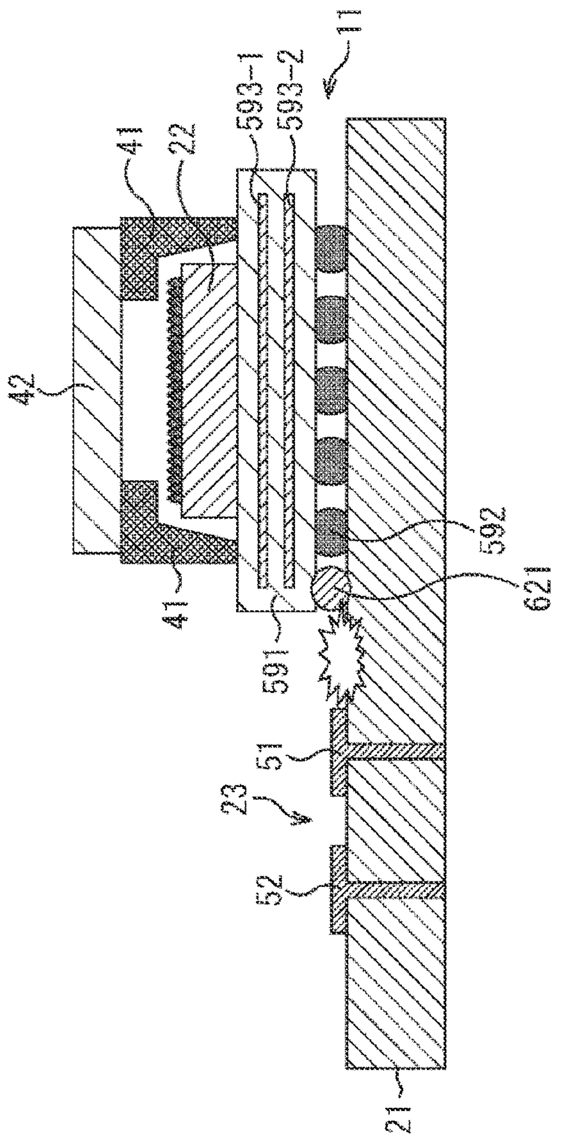
FIG. 21 is a diagram illustrating another configuration example of the sensor module.

In such a case, for example, the sensor module 11 is configured as illustrated in FIG. 21. Note that, in FIG. 21, same reference sign is assigned to a portion corresponding to that in the case of FIG. 20, and description thereof will be omitted as appropriate.

In the sensor module 11 illustrated in FIG. 21, similarly to the case in FIG. 20, the antenna unit 23 and the interposer 591 are disposed on and over the semiconductor substrate 21, and the image sensor 22 is mounted on the interposer 591.

Furthermore, the plurality of bumps for mounting the interposer 591 over the semiconductor substrate 21 includes a plurality of bumps connected to the ground (ground layer) in the semiconductor substrate 21 (hereinafter also referred to as ground bumps).

For example, in the example of FIG. 21, bumps disposed near the antenna unit 23 such as a bump 621 and bumps arranged in the depth direction with respect to the bump 621 are ground bumps. Note that the bump 592 and the like may also be ground bumps.

In particular, the plurality of ground bumps is disposed to be arranged at intervals of ½ wavelength of the emission frequency of the antenna unit 23, that is, at intervals of a length shorter than the wavelength of a millimeter wave emitted by the antenna unit 23, desirably a length that is half the wavelength (½ wavelength).

By disposing and arranging the plurality of ground bumps at such intervals, propagation of unnecessary radiation (electromagnetic wave) or the like generated in the antenna unit 23 to the interposer 591, that is, the image sensor 22 can be further suppressed.

<Modification 2 of Twelfth Embodiment>
<Configuration Example of Sensor Module>

Furthermore, in order to further suppress propagation of unnecessary radiation (electromagnetic wave) or the like generated in the antenna unit 23 to the image sensor 22, a plurality of vias arranged at intervals of ½ wavelength of the emission frequency of the antenna unit 23 may be provided.

Figure 22:
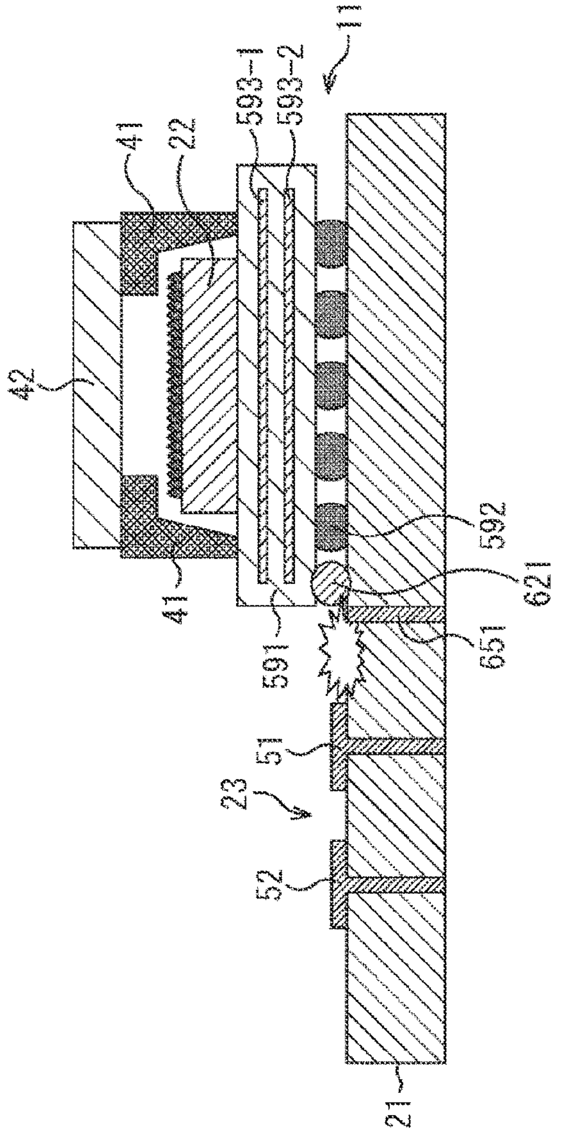
FIG. 22 is a diagram illustrating another configuration example of the sensor module.

In such a case, for example, the sensor module 11 is configured as illustrated in FIG. 22. Note that, in FIG. 22, same reference sign is assigned to a portion corresponding to that in the case of FIG. 21, and description thereof will be omitted as appropriate.

The configuration of the sensor module 11 illustrated in FIG. 22 is a configuration in which a plurality of vias including a via 651 is further provided in the sensor module 11 illustrated in FIG. 21.

In the example of FIG. 22, the via 651 is provided at a position in the semiconductor substrate 21 between the antenna unit 23 and the interposer 591 (image sensor 22).

For example, the via 651 includes a substrate integrated waveguide (SIW) or the like, penetrates the semiconductor substrate 21, and is connected to the ground (ground layer) in the semiconductor substrate 21. Hereinafter, a via provided in the semiconductor substrate 21 and connected to the ground in the semiconductor substrate 21, such as the via 651, is also referred to as a ground via.

Figure 23:
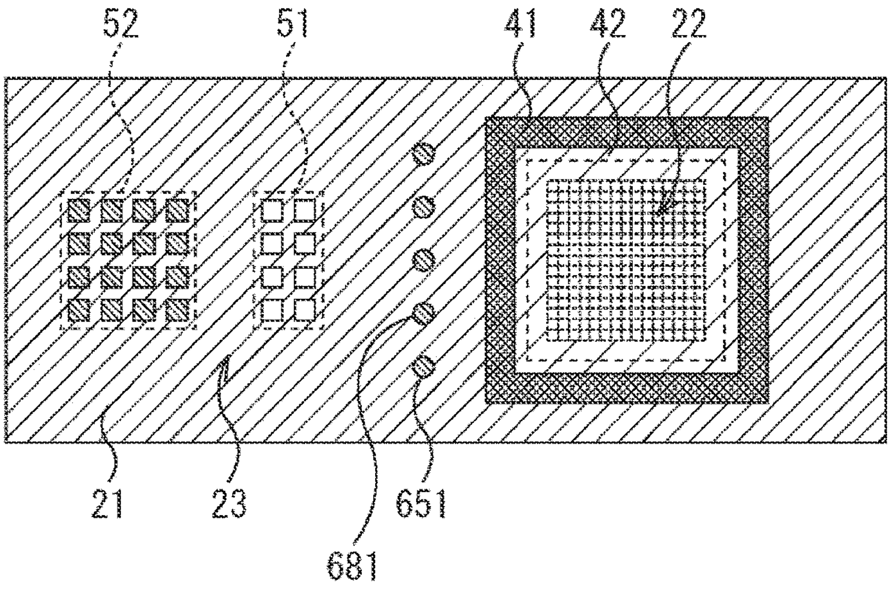
FIG. 23 is a diagram illustrating another configuration example of the sensor module.

For example, as illustrated in FIG. 23, a plurality of ground vias including the via 651 is formed in the semiconductor substrate 21. Note that FIG. 23 is a diagram of the sensor module 11 in FIG. 22 as viewed from above in the downward direction. In FIG. 23, same reference sign is assigned to a portion corresponding to that in the case of FIG. 22, and description thereof will be omitted as appropriate.

In the example of FIG. 23, a plurality of vias including the via 651 and a via 681 is disposed as ground vias by being arranged in a row in the vertical direction in the drawing, between the antenna unit 23 and the interposer 591 (image sensor 22) in the semiconductor substrate 21.

In particular, similarly to the case of ground bumps, the plurality of ground vias is disposed to be arranged at intervals of ½ wavelength of the emission frequency of the antenna unit 23, that is, at intervals of a length shorter than the wavelength of a millimeter wave emitted by the antenna unit 23, desirably a length that is half the wavelength. Note that the distance (interval) between a ground via and a ground bump may also be a length (distance) of ½ wavelength of the emission frequency of the antenna unit 23.

By disposing and arranging the plurality of ground vias in this manner, propagation of unnecessary radiation (electromagnetic wave) or the like generated in the antenna unit 23 to the interposer 591, that is, the image sensor 22 can be further suppressed.

Note that, in FIG. 23, an example in which the plurality of ground vias is disposed by being arranged in a row between the antenna unit 23 and the interposer 591 has been described. However, without being limited to this example, for example, the ground vias may be provided in a plurality of rows, or the ground vias may be disposed such that the periphery of the interposer 591 is surrounded by the plurality of ground vias.

Note that embodiments of the present technology are not limited to the above-described embodiments, and various changes can be made without departing from the gist of the present technology.

Moreover, the present technology can also have the following configuration.

(1)

A semiconductor device including:

a substrate;

a millimeter wave antenna provided on the substrate; and an image sensor provided on the substrate, in which an antenna surface of the millimeter wave antenna and a light receiving surface of the image sensor are disposed at spatially partitioned positions.

(2)

The semiconductor device according to (1), in which the antenna surface is disposed at a position further away from the substrate than the image sensor in a direction perpendicular to the substrate.

(3)

The semiconductor device according to (1) or (2), in which the millimeter wave antenna includes a first antenna formed on the substrate by patterning and a second antenna formed on an antenna substrate disposed immediately above the first antenna on the substrate, and the second antenna is disposed at a position further away from the substrate than the image sensor in a direction perpendicular to the substrate.

(4)

The semiconductor device according to (3), in which the image sensor is disposed in a space surrounded by the substrate and the antenna substrate.

(5)

The semiconductor device according to (4), in which the antenna substrate includes a member containing Si and O as raw materials.

(6)

The semiconductor device according to any one of (3) to (5), in which an air layer is formed between the first antenna and the second antenna.

(7)

The semiconductor device according to (1), in which the millimeter wave antenna is formed on the substrate by patterning.

(8)

The semiconductor device according to (7), in which a frame member is further included that is disposed on the substrate and includes an exposing portion that exposes the antenna surface.

(9)

The semiconductor device according to (8), in which the frame member has conductivity and is electrically connected to a ground provided on the substrate.

(10)

The semiconductor device according to (8) or (9), in which when viewed from a direction perpendicular to a surface of the substrate, the frame member is provided with a plurality of the exposing portions arranged in a first direction and a second direction perpendicular to each other, and the exposing portion has a square shape or a circular shape.

(11)

The semiconductor device according to (8) or (9), in which when viewed from a direction perpendicular to a surface of the substrate, the frame member is provided with a plurality of the exposing portions arranged in a predetermined direction, and the exposing portion has a rectangular shape long in a direction perpendicular to the predetermined direction.

(12)

The semiconductor device according to (1) or (2), in which the millimeter wave antenna is a mounted antenna mounted on the substrate.

(13)

The semiconductor device according to any one of (1) to (3), in which a conductive substance is applied to a surface on a side of the millimeter wave antenna in a structure on the substrate provided between the image sensor and the millimeter wave antenna.

(14)

The semiconductor device according to (13), in which the conductive substance is electrically connected to a ground provided on the substrate.

(15)

The semiconductor device according to any one of (1) to (14), in which an analog ground provided on the substrate functions as an image sensor analog ground and a millimeter wave reflection analog ground.

(16)

The semiconductor device according to (15), in which the analog ground functions as a heat spreader, and a heat dissipation member is connected to the analog ground.

(17)

The semiconductor device according to any one of (1) to (16), in which an analog or digital power supply provided on the substrate functions as a power supply for image sensor and a power supply for millimeter wave radar.

(18)

The semiconductor device according to any one of (1) to (3), in which the image sensor is flip-chip mounted on a surface of the substrate opposite to a surface on which the millimeter wave antenna is provided, and a heat dissipation member is connected to the image sensor and a millimeter wave element disposed on a same surface as the image sensor.

(19)

The semiconductor device according to (1), in which the image sensor is disposed between a transmission antenna and a reception antenna constituting the millimeter wave antenna.

(20)

The semiconductor device according to (2), in which a module that is provided with the millimeter wave antenna and generates an analog signal, and a bottom-raising substrate that is disposed between the substrate and the module and has a plurality of through holes formed therein are further included, and each of a plurality of the through holes is a through hole for transmission of an input signal to the module, for transmission of an output signal from the module, or for power supply.

(21)

The semiconductor device according to (20), in which a ground wiring pattern that surrounds the plurality of the through holes is formed in the bottom-raising substrate.

(22)

The semiconductor device according to (20) or (21), in which a wiring pattern that forms a capacitance is formed in the bottom-raising substrate.

(23)

The semiconductor device according to any one of (20) to (22), in which a light source that outputs distance measuring light received by the image sensor is further included, and the bottom-raising substrate is disposed between the image sensor and the light source over the substrate.

(24)

The semiconductor device according to (1), in which an interposer mounted over the substrate is further included, the image sensor is mounted on the interposer, and the millimeter wave antenna is formed on the substrate.

(25)

The semiconductor device according to (24), in which a gap is provided between the interposer and the substrate.

(26)

The semiconductor device according to (24) or (25), in which a linear coefficient of thermal expansion of the interposer is different from a linear coefficient of thermal expansion of the substrate.

(27)

The semiconductor device according to any one of (24) to (26), in which a ground layer having a planar shape is formed in the interposer.

(28)

The semiconductor device according to any one of (24) to (27), in which a plurality of bumps for mounting the interposer over the substrate includes a ground bump connected to a ground of the substrate, and a plurality of the ground bumps is disposed to be arranged at intervals shorter than a wavelength of a millimeter wave emitted from the millimeter wave antenna.

(29)

The semiconductor device according to any one of (24) to (28), in which a ground via connected to a ground of the substrate is formed in the substrate, and a plurality of the ground vias is disposed to be arranged at intervals shorter than a wavelength of a millimeter wave emitted from the millimeter wave antenna.

(30)

An electronic device including a semiconductor device, in which the semiconductor device includes a substrate, a millimeter wave antenna provided on the substrate, and an image sensor provided on the substrate, and an antenna surface of the millimeter wave antenna and a light receiving surface of the image sensor are disposed at spatially partitioned positions.

REFERENCE SIGNS LIST

11 Sensor module
21 Semiconductor substrate
22 Image sensor
23 Antenna unit
24-1 to 24-4, 24 Element
41 Frame
42 Cover glass
51 Transmission antenna unit
52 Reception antenna unit
81 Antenna unit
121 Antenna unit
131 Antenna substrate
132 Transmission antenna unit
133 Reception antenna unit
191 Conductive substance
221 Frame member
321 Antenna substrate
361 Heat dissipation member
391 Heat dissipation member
502 Bottom-raising substrate
505 Millimeter wave module
506-1 to 506-3, 506 Ground layer
507-1, 507-2, 507 Through hole
561 Light source
591 Interposer
651 Via

The invention claimed is:

1. A semiconductor device, comprising:

a substrate;

a module including a millimeter wave antenna provided on the substrate;

an image sensor provided on the substrate, wherein an antenna surface of the millimeter wave antenna and a light receiving surface of the image sensor are disposed at spatially partitioned positions, wherein the antenna surface is disposed at a position further away from the substrate than the image sensor in a direction perpendicular to the substrate; and a bottom-raising substrate that is disposed between the substrate and the module, wherein the bottom-raising substrate has a plurality of through holes formed therein, and wherein each of a plurality of the through holes is a through hole for transmission of an input signal to the module, for transmission of an output signal from the module, or for power supply.

2. The semiconductor device according to claim 1, wherein a ground wiring pattern that surrounds the plurality of the through holes is formed in the bottom-raising substrate.

3. The semiconductor device according to claim 1, wherein a wiring pattern that forms a capacitance is formed in the bottom-raising substrate.

4. The semiconductor device according to claim 1, wherein a light source that outputs distance measuring light received by the image sensor is further comprised, and the bottom-raising substrate is disposed between the image sensor and the light source over the substrate.

5. The semiconductor device according to claim 1, wherein the millimeter wave antenna is formed on the substrate by patterning.

6. The semiconductor device according to claim 1, wherein the bottom-raising substrate is mounted by bumps to the substrate.

7. The semiconductor device according to claim 1, wherein the module further comprises a module substrate, and wherein the module substrate is mounted by bumps to the bottom-raising substrate.

8. The semiconductor device according to claim 1, wherein the module further comprises a module substrate, and wherein a radio frequency integrated circuit is disposed in the module substrate.

9. The semiconductor device according to claim 8, wherein the radio frequency integrated circuit is disposed at a position further away from the substrate than the image sensor in the direction perpendicular to the substrate.

10. The semiconductor device according to claim 1, wherein the module further comprises a module substrate, and wherein the millimeter wave antenna includes a plurality of patch antennas formed on a surface of the module substrate.

11. The semiconductor device according to claim 10, wherein at least a first one of the patch antennas is part of a transmission antenna unit, and wherein at least a second one of the patch antennas is part of a reception antenna unit.

12. The semiconductor device according to claim 1, wherein the bottom-raising substrate includes a plurality of ground layers.

13. The semiconductor device according to claim 1, wherein the module and the image sensor are disposed on a side of a first surface of the substrate, wherein the direction perpendicular to the substrate is a direction perpendicular to the first surface of the substrate, and wherein the antenna surface is disposed at a position further way from the first surface of the substrate than the image sensor in the direction perpendicular to the first surface of the substrate.

14. An electronic device including a semiconductor device, wherein the semiconductor device comprises a substrate, a module including a millimeter wave antenna provided on the substrate, and an image sensor provided on the substrate, and wherein an antenna surface of the millimeter wave antenna and a light receiving surface of the image sensor are disposed at spatially partitioned positions, wherein the antenna surface is disposed at a position further away from the substrate than the image sensor in a direction perpendicular to the substrate; and a bottom-raising substrate that is disposed between the substrate and the module, wherein the bottom-raising substrate has a plurality of through holes formed therein, and wherein each of a plurality of the through holes is a through hole for transmission of an input signal to the module, for transmission of an output signal from the module, or for power supply.

* * * * *